(12) United States Patent
Ma et al.

(10) Patent No.: US 11,943,051 B2
(45) Date of Patent: Mar. 26, 2024

(54) RATE MATCHING AND CHANNEL INTERLEAVING FOR PROBABILISTIC SHAPING

(71) Applicant: QUALCOMM Incorporated, San Diego, CA (US)

(72) Inventors: Jun Ma, San Diego, CA (US); Xiaoxia Zhang, San Diego, CA (US); Morteza Soltani, San Diego, CA (US); Raviteja Patchava, San Diego, CA (US); Elyes Balti, Austin, TX (US); Tao Luo, San Diego, CA (US); Iyab Issam Sakhnini, San Diego, CA (US); Zhifei Fan, San Diego, CA (US); Dung Ngoc Doan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 141 days.

(21) Appl. No.: 17/482,315

(22) Filed: Sep. 22, 2021

(65) Prior Publication Data

US 2023/0090492 A1 Mar. 23, 2023

(51) Int. Cl.
*H04L 1/00* (2006.01)
*H03M 13/25* (2006.01)
(Continued)

(52) U.S. Cl.
CPC ........ *H04L 1/0071* (2013.01); *H03M 13/255* (2013.01); *H04L 1/0057* (2013.01); *H04L 27/34* (2013.01); *H03M 13/1102* (2013.01); *H03M 13/27* (2013.01); *H03M 13/2703* (2013.01); *H03M 13/271* (2013.01); *H03M 13/2906* (2013.01); *H03M 13/6356* (2013.01); *H04L 1/0013* (2013.01); *H04L 1/0067* (2013.01); *H04L 1/1812* (2013.01); *H04L 1/1864* (2013.01)

(58) Field of Classification Search
CPC ... H04L 1/0071; H04L 1/1812; H04L 1/0057; H04L 1/0067; H04L 1/0013; H04L 1/1864; H04L 27/34; H03M 13/27; H03M 13/271; H03M 13/6356; H03M 13/2703; H03M 13/2906; H03M 13/1102; H03M 13/255
See application file for complete search history.

(56) References Cited

U.S. PATENT DOCUMENTS

| 2007/0002969 A1* | 1/2007 | Jeong | H04L 1/0045 |
| | | | 375/308 |
| 2009/0086849 A1* | 4/2009 | Tsai | H04L 1/0067 |
| | | | 375/295 |

(Continued)

*Primary Examiner* — April Y Blair
*Assistant Examiner* — Sazzad Hossain
(74) *Attorney, Agent, or Firm* — Procopio, Cory, Hargreaves & Savitch LLP

(57) ABSTRACT

Aspects present herein relate to methods and devices for wireless communication including an apparatus, e.g., a UE and/or a base station. The apparatus may encode a plurality of bits associated with QAM, the plurality of bits corresponding to a circular buffer associated with at least one RV, the plurality of bits including a plurality of systematic bits. The apparatus may also transfer the plurality of bits from the circular buffer associated with the at least one RV to a first buffer and a second buffer. Additionally, the apparatus may map the plurality of bits from the first buffer and the second buffer to a plurality of modulation symbols.

29 Claims, 15 Drawing Sheets

(51) Int. Cl.
*H04L 27/34* (2006.01)
*H03M 13/00* (2006.01)
*H03M 13/11* (2006.01)
*H03M 13/27* (2006.01)
*H03M 13/29* (2006.01)
*H04L 1/1812* (2023.01)
*H04L 1/1829* (2023.01)

(56) References Cited

U.S. PATENT DOCUMENTS

2019/0052290 A1* 2/2019 Andersson ........ H03M 13/6393
2019/0268926 A1* 8/2019 Yoshimura .............. H04L 27/26
2020/0127758 A1* 4/2020 Khoshnevisan ..... H04B 17/318

* cited by examiner

Prefix coding for 256-QAM

| Input | Output | I/Q Level | Prob p |
|---|---|---|---|
| 00 | 100 | 1 | 1/4 |
| 01 | 101 | 3 | 1/4 |
| 111 | 111 | 5 | 1/8 |
| 100 | 110 | 7 | 1/8 |
| 101 | 010 | 9 | 1/8 |
| 1101 | 011 | 11 | 1/16 |
| 11000 | 001 | 13 | 1/32 |
| 11001 | 000 | 15 | 1/32 |

Example 1-bit shifted bit sequence xxx,100,101,111,110,010,1xx,...

RATE MATCHING AND CHANNEL INTERLEAVING FOR PROBABILISTIC SHAPING

TECHNICAL FIELD

The present disclosure relates generally to communication systems, and more particularly, to rate matching and channel interleaving in wireless communications.

INTRODUCTION

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. 5G NR includes services associated with enhanced mobile broadband (eMBB), massive machine type communications (mMTC), and ultra-reliable low latency communications (URLLC). Some aspects of 5G NR may be based on the 4G Long Term Evolution (LTE) standard. There exists a need for further improvements in 5G NR technology. These improvements may also be applicable to other multi-access technologies and the telecommunication standards that employ these technologies.

BRIEF SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, a method, a computer-readable medium, and an apparatus are provided. The apparatus may be a user equipment (UE). The apparatus may encode a plurality of bits associated with quadrature amplitude modulation (QAM), the plurality of bits corresponding to a circular buffer associated with at least one redundancy version (RV), the plurality of bits including a plurality of systematic bits. The apparatus may also configure at least one channel interleaver for the plurality of bits associated with the QAM. Additionally, the apparatus may enable or disable the at least one channel interleaver based on the at least one RV. The apparatus may also store the plurality of bits in the circular buffer prior to transferring the plurality of bits to the first buffer and the second buffer. Further, the apparatus may transfer the plurality of bits from the circular buffer associated with the at least one RV to a first buffer and a second buffer. The apparatus may also map the plurality of bits from the first buffer and the second buffer to a plurality of modulation symbols. Moreover, the apparatus may transmit, to a base station, the plurality of modulation symbols, where the plurality of modulation symbols is transmitted after the plurality of bits is mapped from the first buffer and the second buffer to the plurality of modulation symbols.

In another aspect of the disclosure, a method, a computer-readable medium, and an apparatus are provided. The apparatus may be a base station. The apparatus may encode a plurality of bits associated with quadrature amplitude modulation (QAM), the plurality of bits corresponding to a circular buffer associated with at least one redundancy version (RV), the plurality of bits including a plurality of systematic bits. The apparatus may also configure at least one channel interleaver for the plurality of bits associated with the QAM. Additionally, the apparatus may enable or disable the at least one channel interleaver based on the at least one RV. The apparatus may also store the plurality of bits in the circular buffer prior to transferring the plurality of bits to the first buffer and the second buffer. Further, the apparatus may transfer the plurality of bits from the circular buffer associated with the at least one RV to a first buffer and a second buffer. The apparatus may also map the plurality of bits from the first buffer and the second buffer to a plurality of modulation symbols. Moreover, the apparatus may transmit, to a user equipment (UE), the plurality of modulation symbols, where the plurality of modulation symbols is transmitted after the plurality of bits is mapped from the first buffer and the second buffer to the plurality of modulation symbols.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

FIG. 5A is a diagram illustrating an example prefix encoding process.

FIG. 5B is a diagram illustrating an example shifted bit sequence.

DETAILED DESCRIPTION

Figure 1:
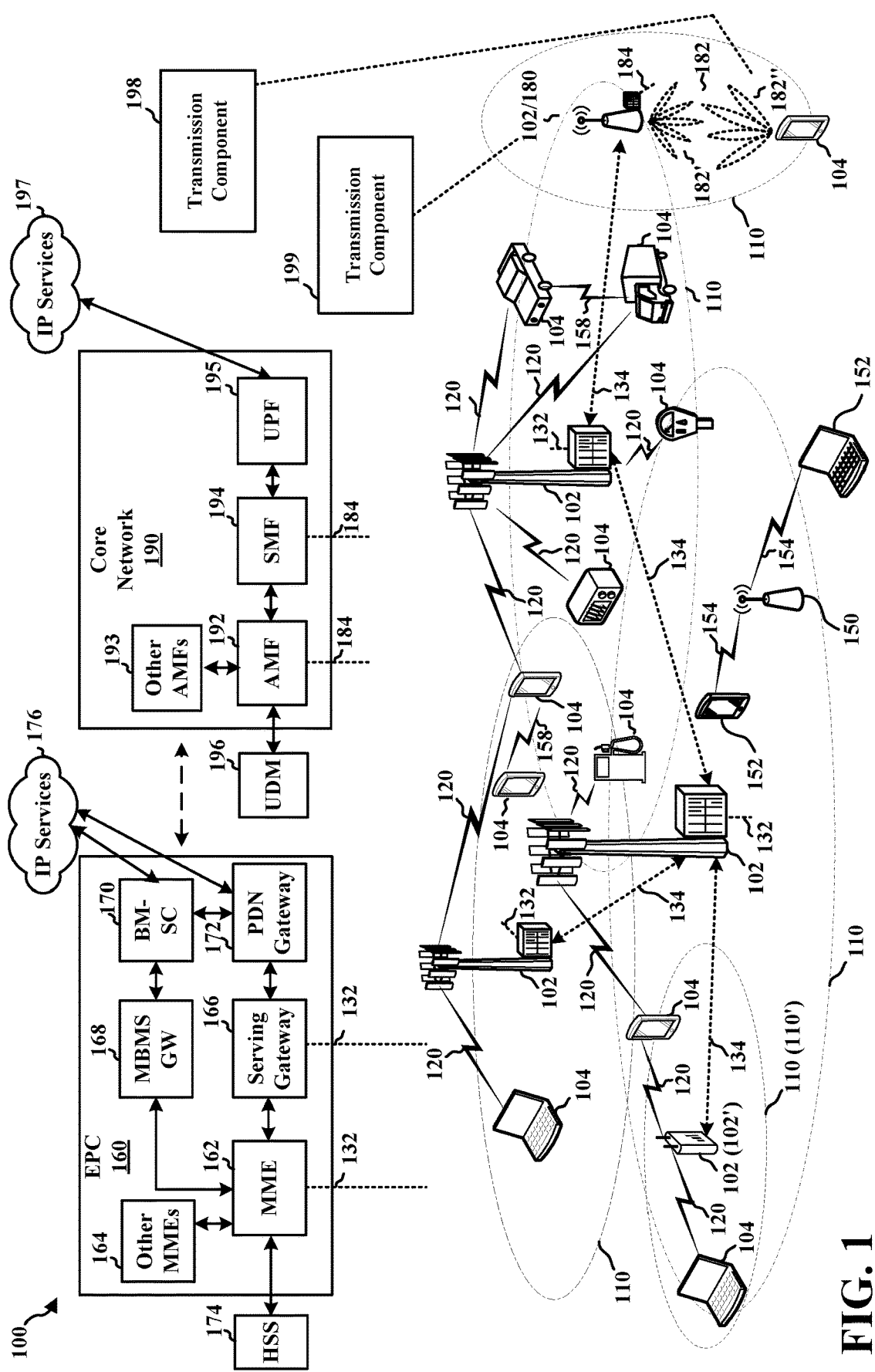
FIG. 1 is a diagram illustrating an example of a wireless communications system and an access network.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the types of computer-readable media, or any other medium that can be used to store computer executable code in the form of instructions or data structures that can be accessed by a computer.

While aspects and implementations are described in this application by illustration to some examples, those skilled in the art will understand that additional implementations and use cases may come about in many different arrangements and scenarios. Innovations described herein may be implemented across many differing platform types, devices, systems, shapes, sizes, and packaging arrangements. For example, implementations and/or uses may come about via integrated chip implementations and other non-module-component based devices (e.g., end-user devices, vehicles, communication devices, computing devices, industrial equipment, retail/purchasing devices, medical devices, artificial intelligence (AI)-enabled devices, etc.). While some examples may or may not be specifically directed to use cases or applications, a wide assortment of applicability of described innovations may occur. Implementations may range a spectrum from chip-level or modular components to non-modular, non-chip-level implementations and further to aggregate, distributed, or original equipment manufacturer (OEM) devices or systems incorporating one or more aspects of the described innovations. In some practical settings, devices incorporating described aspects and features may also include additional components and features for implementation and practice of claimed and described aspect. For example, transmission and reception of wireless signals necessarily includes a number of components for analog and digital purposes (e.g., hardware components including antenna, RF-chains, power amplifiers, modulators, buffer, processor(s), interleaver, adders/summers, etc.). It is intended that innovations described herein may be practiced in a wide variety of devices, chip-level components, systems, distributed arrangements, aggregated or disaggregated components, end-user devices, etc. of varying sizes, shapes, and constitution.

FIG. 1 is a diagram illustrating an example of a wireless communications system and an access network 100. The wireless communications system (also referred to as a wireless wide area network (WWAN)) includes base stations 102, UEs 104, an Evolved Packet Core (EPC) 160, and another core network 190 (e.g., a 5G Core (5GC)). The base stations 102 may include macrocells (high power cellular base station) and/or small cells (low power cellular base station). The macrocells include base stations. The small cells include femtocells, picocells, and microcells.

The base stations 102 configured for 4G LTE (collectively referred to as Evolved Universal Mobile Telecommunications System (UMTS) Terrestrial Radio Access Network (E-UTRAN)) may interface with the EPC 160 through first backhaul links 132 (e.g., S1 interface). The base stations 102 configured for 5G NR (collectively referred to as Next Generation RAN (NG-RAN)) may interface with core network 190 through second backhaul links 184. In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 102 may communicate directly or indirectly (e.g., through the EPC 160 or core network 190) with each other over third backhaul links 134 (e.g., X2 interface). The first backhaul links 132, the second backhaul links 184, and the third backhaul links 134 may be wired or wireless.

The base stations 102 may wirelessly communicate with the UEs 104. Each of the base stations 102 may provide communication coverage for a respective geographic coverage area 110. There may be overlapping geographic coverage areas 110. For example, the small cell 102' may have a coverage area 110' that overlaps the coverage area 110 of one or more macro base stations 102. A network that includes both small cell and macrocells may be known as a heterogeneous network. A heterogeneous network may also include Home Evolved Node Bs (eNBs) (HeNBs), which may provide service to a restricted group known as a closed subscriber group (CSG). The communication links 120 between the base stations 102 and the UEs 104 may include uplink (UL) (also referred to as reverse link) transmissions from a UE 104 to a base station 102 and/or downlink (DL) (also referred to as forward link) transmissions from a base station 102 to a UE 104. The communication links 120 may use multiple-input and multiple-output (MIMO) antenna technology, including spatial multiplexing, beamforming, and/or transmit diversity. The communication links may be through one or more carriers. The base stations 102/UEs 104 may use spectrum up to Y MHz (e.g., 5, 10, 15, 20, 100, 400, etc. MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or fewer carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

Certain UEs 104 may communicate with each other using device-to-device (D2D) communication link 158. The D2D communication link 158 may use the DL/UL WWAN spectrum. The D2D communication link 158 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, WiMedia, Bluetooth, ZigBee, Wi-Fi based on the Institute of Electrical and Electronics Engineers (IEEE) 802.11 standard, LTE, or NR.

The wireless communications system may further include a Wi-Fi access point (AP) 150 in communication with Wi-Fi stations (STAs) 152 via communication links 154, e.g., in a 5 GHz unlicensed frequency spectrum or the like. When communicating in an unlicensed frequency spectrum, the STAs 152/AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ NR and use the same unlicensed frequency spectrum (e.g., 5 GHz, or the like) as used by the Wi-Fi AP 150. The small cell 102', employing NR in an unlicensed frequency spectrum, may boost coverage to and/or increase capacity of the access network.

The electromagnetic spectrum is often subdivided, based on frequency/wavelength, into various classes, bands, channels, etc. In 5G NR, two initial operating bands have been identified as frequency range designations FR1 (410 MHz-7.125 GHz) and FR2 (24.25 GHz-52.6 GHz). Although a portion of FR1 is greater than 6 GHz, FR1 is often referred to (interchangeably) as a "sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF) band (30 GHz-300 GHz) which is identified by the International Telecommunications Union (ITU) as a "millimeter wave" band.

The frequencies between FR1 and FR2 are often referred to as mid-band frequencies. Recent 5G NR studies have identified an operating band for these mid-band frequencies as frequency range designation FR3 (7.125 GHz-24.25 GHz). Frequency bands falling within FR3 may inherit FR1 characteristics and/or FR2 characteristics, and thus may effectively extend features of FR1 and/or FR2 into mid-band frequencies. In addition, higher frequency bands are currently being explored to extend 5G NR operation beyond 52.6 GHz. For example, three higher operating bands have been identified as frequency range designations FR4a or FR4-1 (52.6 GHz-71 GHz), FR4 (52.6 GHz-114.25 GHz), and FR5 (114.25 GHz-300 GHz). Each of these higher frequency bands falls within the EHF band.

With the above aspects in mind, unless specifically stated otherwise, it should be understood that the term "sub-6 GHz" or the like if used herein may broadly represent frequencies that may be less than 6 GHz, may be within FR1, or may include mid-band frequencies. Further, unless specifically stated otherwise, it should be understood that the term "millimeter wave" or the like if used herein may broadly represent frequencies that may include mid-band frequencies, may be within FR2, FR4, FR4-a or FR4-1, and/or FR5, or may be within the EHF band.

A base station 102, whether a small cell 102' or a large cell (e.g., macro base station), may include and/or be referred to as an eNB, gNodeB (gNB), or another type of base station. Some base stations, such as gNB 180 may operate in a traditional sub 6 GHz spectrum, in millimeter wave frequencies, and/or near millimeter wave frequencies in communication with the UE 104. When the gNB 180 operates in millimeter wave or near millimeter wave frequencies, the gNB 180 may be referred to as a millimeter wave base station. The millimeter wave base station 180 may utilize beamforming 182 with the UE 104 to compensate for the path loss and short range. The base station 180 and the UE 104 may each include a plurality of antennas, such as antenna elements, antenna panels, and/or antenna arrays to facilitate the beamforming.

The base station 180 may transmit a beamformed signal to the UE 104 in one or more transmit directions 182'. The UE 104 may receive the beamformed signal from the base station 180 in one or more receive directions 182". The UE 104 may also transmit a beamformed signal to the base station 180 in one or more transmit directions. The base station 180 may receive the beamformed signal from the UE 104 in one or more receive directions. The base station 180/UE 104 may perform beam training to determine the best receive and transmit directions for each of the base station 180/UE 104. The transmit and receive directions for the base station 180 may or may not be the same. The transmit and receive directions for the UE 104 may or may not be the same.

The EPC 160 may include a Mobility Management Entity (MME) 162, other MMEs 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a PS Streaming Service, and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The core network 190 may include an Access and Mobility Management Function (AMF) 192, other AMFs 193, a Session Management Function (SMF) 194, and a User Plane Function (UPF) 195. The AMF 192 may be in communication with a Unified Data Management (UDM) 196. The AMF 192 is the control node that processes the signaling between the UEs 104 and the core network 190. Generally, the AMF 192 provides QoS flow and session management. All user Internet protocol (IP) packets are transferred through the UPF 195. The UPF 195 provides UE IP address allocation as well as other functions. The UPF 195 is connected to the IP Services 197. The IP Services 197 may include the Internet, an intranet, an IP Multimedia Subsystem (IMS), a Packet Switch (PS) Streaming (PSS) Service, and/or other IP services.

The base station may include and/or be referred to as a gNB, Node B, eNB, an access point, a base transceiver station, a radio base station, a radio transceiver, a transceiver function, a basic service set (BSS), an extended service set (ESS), a transmit reception point (TRP), or some other suitable terminology. The base station 102 provides an access point to the EPC 160 or core network 190 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a large or small kitchen appliance, a healthcare device, an implant, a sensor/actuator, a display, or any other similar functioning device. Some of the UEs 104 may be referred to as IoT devices (e.g., parking meter, gas pump, toaster, vehicles, heart monitor, etc.). The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. In some scenarios, the term UE may also apply to one or more companion devices such as in a device constellation arrangement. One or more of these devices may collectively access the network and/or individually access the network.

Referring again to FIG. 1, in certain aspects, the UE 104 may include a transmission component 198 configured to encode a plurality of bits associated with quadrature amplitude modulation (QAM), the plurality of bits corresponding to a circular buffer associated with at least one redundancy version (RV), the plurality of bits including a plurality of systematic bits. Transmission component 198 may also be configured to configure at least one channel interleaver for the plurality of bits associated with the QAM. Transmission component 198 may also be configured to enable or disable the at least one channel interleaver based on the at least one RV. Transmission component 198 may also be configured to store the plurality of bits in the circular buffer prior to transferring the plurality of bits to the first buffer and the second buffer. Transmission component 198 may also be configured to transfer the plurality of bits from the circular buffer associated with the at least one RV to a first buffer and a second buffer. Transmission component 198 may also be configured to map the plurality of bits from the first buffer and the second buffer to a plurality of modulation symbols. Transmission component 198 may also be configured to transmit, to a base station, the plurality of modulation symbols, where the plurality of modulation symbols is transmitted after the plurality of bits is mapped from the first buffer and the second buffer to the plurality of modulation symbols.

Referring again to FIG. 1, in certain aspects, the base station 180 may include a transmission component 199 configured to encode a plurality of bits associated with quadrature amplitude modulation (QAM), the plurality of bits corresponding to a circular buffer associated with at least one redundancy version (RV), the plurality of bits including a plurality of systematic bits. Transmission component 199 may also be configured to configure at least one channel interleaver for the plurality of bits associated with the QAM. Transmission component 199 may also be configured to enable or disable the at least one channel interleaver based on the at least one RV. Transmission component 199 may also be configured to store the plurality of bits in the circular buffer prior to transferring the plurality of bits to the first buffer and the second buffer. Transmission component 199 may also be configured to transfer the plurality of bits from the circular buffer associated with the at least one RV to a first buffer and a second buffer. Transmission component 199 may also be configured to map the plurality of bits from the first buffer and the second buffer to a plurality of modulation symbols. Transmission component 199 may also be configured to transmit, to a user equipment (UE), the plurality of modulation symbols, where the plurality of modulation symbols is transmitted after the plurality of bits is mapped from the first buffer and the second buffer to the plurality of modulation symbols.

Although the following description may be focused on 5G NR, the concepts described herein may be applicable to other similar areas, such as LTE, LTE-A, CDMA, GSM, and other wireless technologies.

Figure 2:
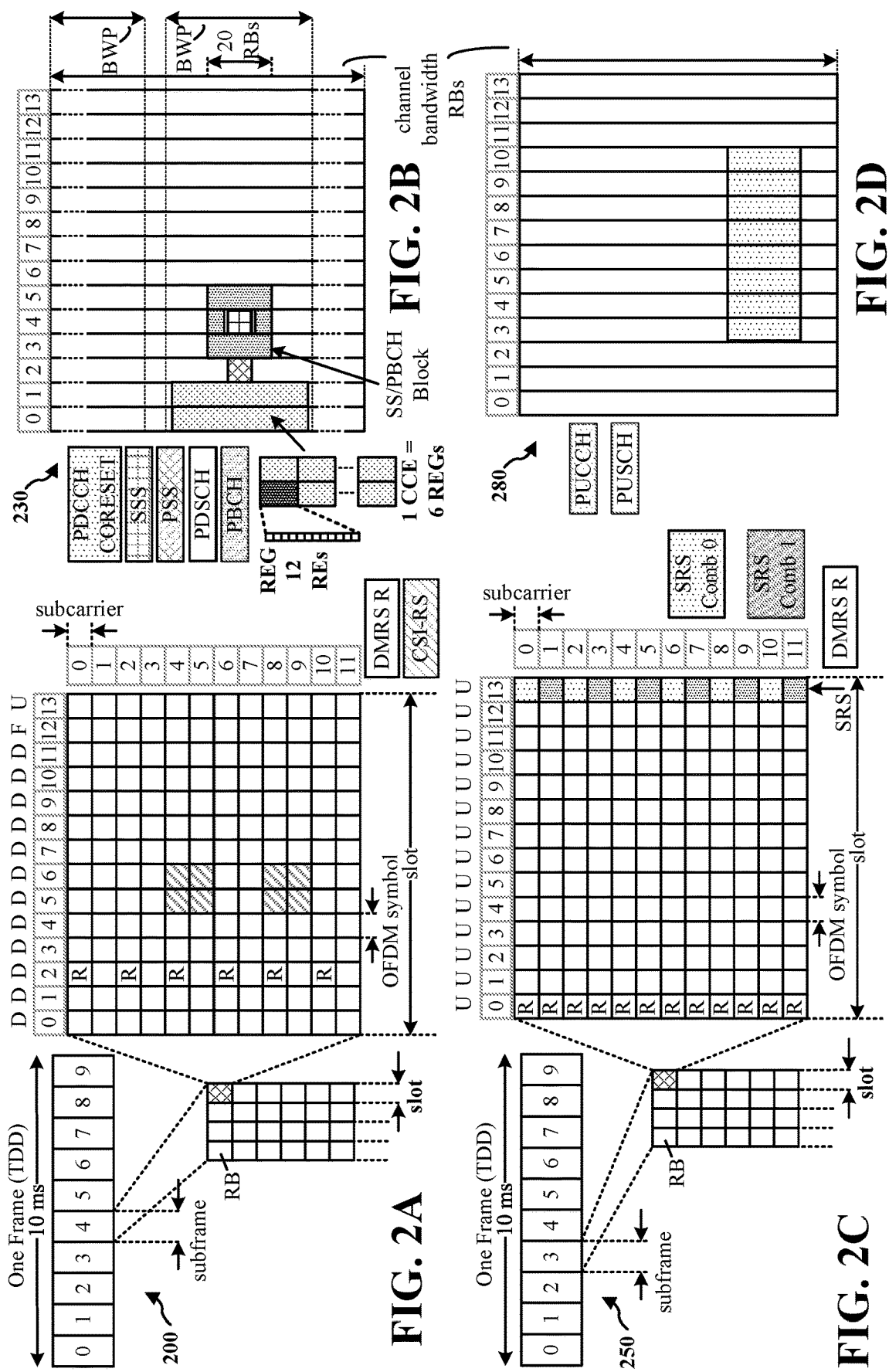
FIG. 2A is a diagram illustrating an example of a first frame, in accordance with various aspects of the present disclosure.
FIG. 2B is a diagram illustrating an example of DL channels within a subframe, in accordance with various aspects of the present disclosure.
FIG. 2C is a diagram illustrating an example of a second frame, in accordance with various aspects of the present disclosure.
FIG. 2D is a diagram illustrating an example of UL channels within a subframe, in accordance with various aspects of the present disclosure.

FIG. 2A is a diagram 200 illustrating an example of a first subframe within a 5G NR frame structure. FIG. 2B is a diagram 230 illustrating an example of DL channels within a 5G NR subframe. FIG. 2C is a diagram 250 illustrating an example of a second subframe within a 5G NR frame structure. FIG. 2D is a diagram 280 illustrating an example of UL channels within a 5G NR subframe. The 5G NR frame structure may be frequency division duplexed (FDD) in which for a particular set of subcarriers (carrier system bandwidth), subframes within the set of subcarriers are dedicated for either DL or UL, or may be time division duplexed (TDD) in which for a particular set of subcarriers (carrier system bandwidth), subframes within the set of subcarriers are dedicated for both DL and UL. In the examples provided by FIGS. 2A, 2C, the 5G NR frame structure is assumed to be TDD, with subframe 4 being configured with slot format 28 (with mostly DL), where D is DL, U is UL, and F is flexible for use between DL/UL, and subframe 3 being configured with slot format 1 (with all UL). While subframes 3, 4 are shown with slot formats 1, 28, respectively, any particular subframe may be configured with any of the various available slot formats 0-61. Slot formats 0, 1 are all DL, UL, respectively. Other slot formats 2-61 include a mix of DL, UL, and flexible symbols. UEs are configured with the slot format (dynamically through DL control information (DCI), or semi-statically/statically through radio resource control (RRC) signaling) through a received slot format indicator (SFI). Note that the description infra applies also to a 5G NR frame structure that is TDD.

FIGS. 2A-2D illustrate a frame structure, and the aspects of the present disclosure may be applicable to other wireless communication technologies, which may have a different frame structure and/or different channels. A frame (10 ms) may be divided into 10 equally sized subframes (1 ms). Each subframe may include one or more time slots. Subframes may also include mini-slots, which may include 7, 4, or 2 symbols. Each slot may include 14 or 12 symbols, depending on whether the cyclic prefix (CP) is normal or extended. For normal CP, each slot may include 14 symbols, and for extended CP, each slot may include 12 symbols. The symbols on DL may be CP orthogonal frequency division multiplexing (OFDM) (CP-OFDM) symbols. The symbols on UL may be CP-OFDM symbols (for high throughput scenarios) or discrete Fourier transform (DFT) spread OFDM (DFT-s-OFDM) symbols (also referred to as single carrier frequency-division multiple access (SC-FDMA) symbols) (for power limited scenarios; limited to a single stream transmission). The number of slots within a subframe is based on the CP and the numerology. The numerology defines the subcarrier spacing (SCS) and, effectively, the symbol length/duration, which is equal to 1/SCS.

| $\mu$ | SCS $\Delta f = 2^\mu \cdot 15[\mathrm{kHz}]$ | Cyclic prefix |
|---|---|---|
| 0 | 15 | Normal |
| 1 | 30 | Normal |
| 2 | 60 | Normal, Extended |
| 3 | 120 | Normal |
| 4 | 240 | Normal |

For normal CP (14 symbols/slot), different numerologies $\mu$ 0 to 4 allow for 1, 2, 4, 8, and 16 slots, respectively, per subframe. For extended CP, the numerology 2 allows for 4 slots per subframe. Accordingly, for normal CP and numerology $\mu$, there are 14 symbols/slot and $2^\mu$ slots/subframe. The subcarrier spacing may be equal to $2^\mu *15$ kHz, where $\mu$ is the numerology 0 to 4. As such, the numerology $\mu=0$ has a subcarrier spacing of 15 kHz and the numerology $\mu=4$ has a subcarrier spacing of 240 kHz. The symbol length/duration is inversely related to the subcarrier spacing. FIGS. 2A-2D provide an example of normal CP with 14 symbols per slot and numerology $\mu=2$ with 4 slots per subframe. The slot duration is 0.25 ms, the subcarrier spacing is 60 kHz, and the symbol duration is approximately 16.67 $\mu$s. Within a set of frames, there may be one or more different bandwidth parts (BWPs) (see FIG. 2B) that are frequency division multiplexed. Each BWP may have a particular numerology and CP (normal or extended).

A resource grid may be used to represent the frame structure. Each time slot includes a resource block (RB) (also referred to as physical RBs (PRBs)) that extends 12 consecutive subcarriers. The resource grid is divided into multiple resource elements (REs). The number of bits carried by each RE depends on the modulation scheme.

As illustrated in FIG. 2A, some of the REs carry reference (pilot) signals (RS) for the UE. The RS may include demodulation RS (DM-RS) (indicated as R for one particular configuration, but other DM-RS configurations are possible) and channel state information reference signals (CSI-RS) for channel estimation at the UE. The RS may also include beam measurement RS (BRS), beam refinement RS (BRRS), and phase tracking RS (PT-RS).

FIG. 2B illustrates an example of various DL channels within a subframe of a frame. The physical downlink control channel (PDCCH) carries DCI within one or more control channel elements (CCEs) (e.g., 1, 2, 4, 8, or 16 CCEs), each CCE including six RE groups (REGs), each REG including 12 consecutive REs in an OFDM symbol of an RB. A PDCCH within one BWP may be referred to as a control resource set (CORESET). A UE is configured to monitor PDCCH candidates in a PDCCH search space (e.g., common search space, UE-specific search space) during PDCCH monitoring occasions on the CORESET, where the PDCCH candidates have different DCI formats and different aggregation levels. Additional BWPs may be located at greater and/or lower frequencies across the channel bandwidth. A primary synchronization signal (PSS) may be within symbol 2 of particular subframes of a frame. The PSS is used by a UE 104 to determine subframe/symbol timing and a physical layer identity. A secondary synchronization signal (SSS) may be within symbol 4 of particular subframes of a frame. The SSS is used by a UE to determine a physical layer cell identity group number and radio frame timing. Based on the physical layer identity and the physical layer cell identity group number, the UE can determine a physical cell identifier (PCI). Based on the PCI, the UE can determine the locations of the DM-RS. The physical broadcast channel (PBCH), which carries a master information block (MIB), may be logically grouped with the PSS and SSS to form a synchronization signal (SS)/PBCH block (also referred to as SS block (SSB)). The MIB provides a number of RBs in the system bandwidth and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry DM-RS (indicated as R for one particular configuration, but other DM-RS configurations are possible) for channel estimation at the base station. The UE may transmit DM-RS for the physical uplink control channel (PUCCH) and DM-RS for the physical uplink shared channel (PUSCH). The PUSCH DM-RS may be transmitted in the first one or two symbols of the PUSCH. The PUCCH DM-RS may be transmitted in different configurations depending on whether short or long PUCCHs are transmitted and depending on the particular PUCCH format used. The UE may transmit sounding reference signals (SRS). The SRS may be transmitted in the last symbol of a subframe. The SRS may have a comb structure, and a UE may transmit SRS on one of the combs. The SRS may be used by a base station for channel quality estimation to enable frequency-dependent scheduling on the UL.

FIG. 2D illustrates an example of various UL channels within a subframe of a frame. The PUCCH may be located as indicated in one configuration. The PUCCH carries uplink control information (UCI), such as scheduling requests, a channel quality indicator (CQI), a precoding matrix indicator (PMI), a rank indicator (RI), and hybrid automatic repeat request (HARQ) acknowledgment (ACK) (HARQ-ACK) feedback (i.e., one or more HARQ ACK bits indicating one or more ACK and/or negative ACK (NACK)). The PUSCH carries data, and may additionally be used to carry a buffer status report (BSR), a power headroom report (PHR), and/or UCI.

Figure 3:
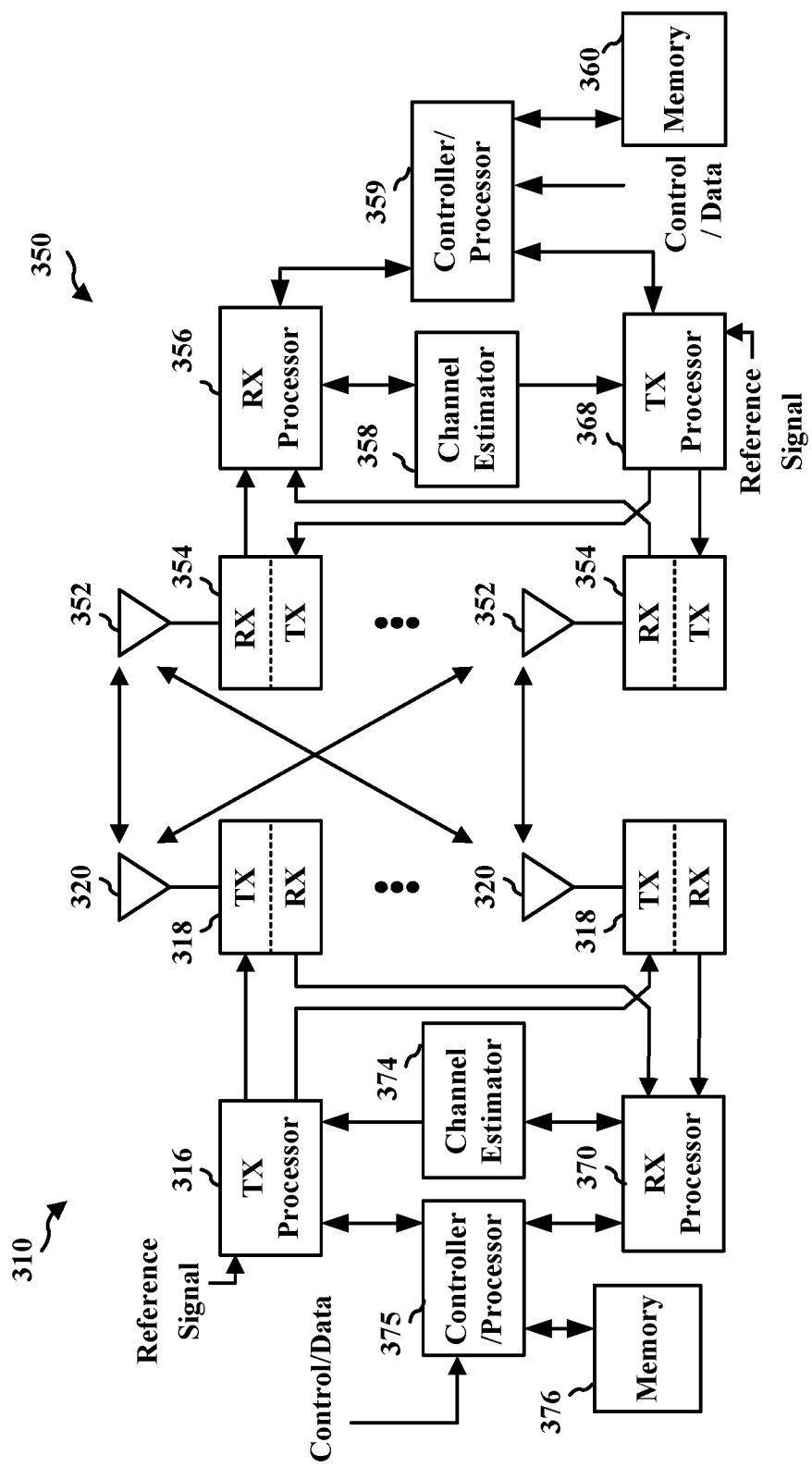
FIG. 3 is a diagram illustrating an example of a base station and user equipment (UE) in an access network.

FIG. 3 is a block diagram of a base station 310 in communication with a UE 350 in an access network. In the DL, IP packets from the EPC 160 may be provided to a controller/processor 375. The controller/processor 375 implements layer 3 and layer 2 functionality. Layer 3 includes a radio resource control (RRC) layer, and layer 2 includes a service data adaptation protocol (SDAP) layer, a packet data convergence protocol (PDCP) layer, a radio link control (RLC) layer, and a medium access control (MAC) layer. The controller/processor 375 provides RRC layer functionality associated with broadcasting of system information (e.g., MIB, SIBs), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318 TX. Each transmitter 318 TX may modulate a radio frequency (RF) carrier with a respective spatial stream for transmission.

At the UE 350, each receiver 354 RX receives a signal through its respective antenna 352. Each receiver 354 RX recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the base station 310. These soft decisions may be based on channel estimates computed by the channel estimator 358. The soft decisions are then decoded and deinterleaved to recover the data and control signals that were originally transmitted by the base station 310 on the physical channel. The data and control signals are then provided to the controller/processor 359, which implements layer 3 and layer 2 functionality.

The controller/processor 359 can be associated with a memory 360 that stores program codes and data. The memory 360 may be referred to as a computer-readable medium. In the UL, the controller/processor 359 provides demultiplexing between transport and logical channels, packet reassembly, deciphering, header decompression, and control signal processing to recover IP packets from the EPC 160. The controller/processor 359 is also responsible for error detection using an ACK and/or NACK protocol to support HARQ operations.

Similar to the functionality described in connection with the DL transmission by the base station 310, the controller/processor 359 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the base station 310 may be used by the TX processor 368 to select the appropriate coding and modulation schemes, and to facilitate spatial processing. The spatial streams generated by the TX processor 368 may be provided to different antenna 352 via separate transmitters 354TX. Each transmitter 354TX may modulate an RF carrier with a respective spatial stream for transmission.

The UL transmission is processed at the base station 310 in a manner similar to that described in connection with the receiver function at the UE 350. Each receiver 318RX receives a signal through its respective antenna 320. Each receiver 318RX recovers information modulated onto an RF carrier and provides the information to a RX processor 370.

The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover IP packets from the UE 350. IP packets from the controller/processor 375 may be provided to the EPC 160. The controller/processor 375 is also responsible for error detection using an ACK and/or NACK protocol to support HARQ operations.

At least one of the TX processor 368, the RX processor 356, and the controller/processor 359 may be configured to perform aspects in connection with 198 of FIG. 1.

At least one of the TX processor 316, the RX processor 370, and the controller/processor 375 may be configured to perform aspects in connection with 199 of FIG. 1.

Some aspects of wireless communication may utilize quadrature amplitude modulation (QAM), i.e., a type of modulation method that is used to transmit information. QAM is a form of modulation that combines phase modulation and amplitude modulation. Further, QAM may include digital modulation methods or analog modulation methods. For instance, QAM may convey multiple analog signals or digital bit streams by changing (i.e., modulating) the amplitudes of two carrier waves. This modulation process may be performed using an amplitude-shift keying (ASK) digital modulation scheme or an amplitude modulation (AM) analog modulation scheme. A transmitted signal may be created by adding the two carrier waves together. In some instances, the QAM scheme may represent bits as points in a quadrant grid, i.e., a constellation map, which may be referred to as QAM constellation. For example, a constellation map may be a graph of the phase and amplitude modulation points in a given modulation scheme.

Some instances of QAM constellations or constellation maps may utilize each value with equal probability. Also, information theory states that an optimum constellation map includes a two-dimensional (2D) Gaussian distribution. Non-uniform spacing within a QAM constellation is one way to approximate a 2D Gaussian distribution. However, non-uniform spacing may result in increased demodulation complexity.

Probabilistic shaping of the constellation map is another alternative which controls the probability of each modulation value to approximate a 2D Gaussian distribution, such as by using a uniformly spaced constellation. In some instances, a uniformly spaced constellation may utilize a shaping encoder at a transmitter prior to modulation and a shaping decoder at a receiver after demodulation. Currently, shaping encoders may include variable rate encoders based on a type of coding, e.g., Huffman coding. For example, a fixed-sized block of pre-shaped bits may be converted into a variable-sized block of post-shaped bits. In order to deal with the variable rate code, methods may be needed to compensate for the variable rate code.

Some examples of probabilistic shaping may include an outer source encoder to change the distribution of amplitude mapping bits, e.g., pulse-amplitude modulation (PAM) amplitude mapping bits. In some aspects, probabilistic shaping may include different types of encoding, e.g., arithmetic encoding and prefix encoding, where prefix encoding may be more suitable in some instances due to complexity. Aspects of probabilistic shaping may also include different types of encoding flows, such as a shaping-low density parity check (LDPC) encoding flow. In shaping-LDPC encoding flows, different types of bits may be distributed or mapped, such as parity bits and systematic bits. For instance, parity bits may be evenly distributed and used for in-phase and quadrature (I/Q) sign bits. Also, systematic bits may be mapped to a QAM amplitude and may need to be pre-encoded.

Figure 4:
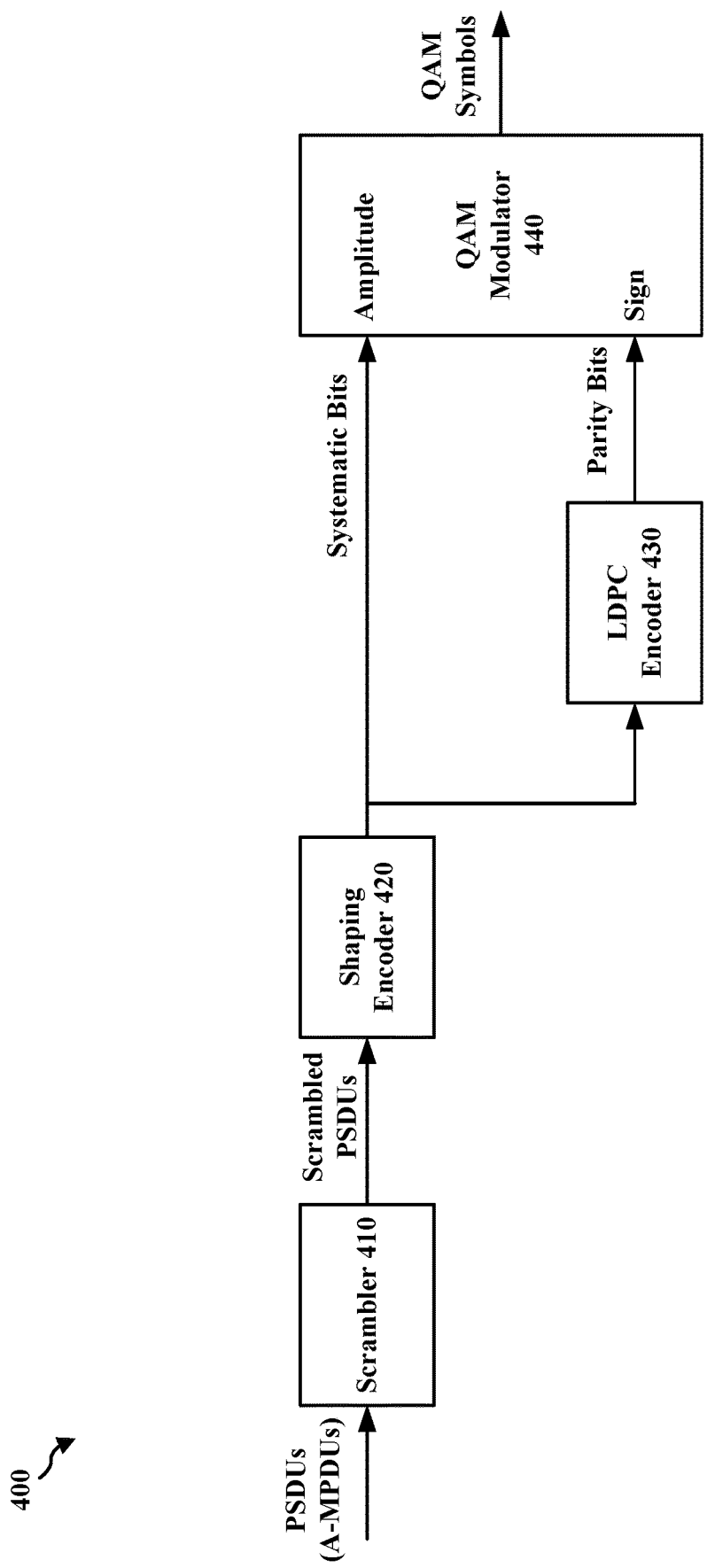
FIG. 4 is a diagram illustrating an example encoding process.

FIG. 4 illustrates a diagram 400 of one example of an encoding process. More specifically, diagram 400 in FIG. 4 displays an encoding process for probabilistic shaping. As shown in FIG. 4, diagram 400 includes scrambler 410, shaping encoder 420, LDPC encoder 430, and QAM modulator 440. FIG. 4 illustrates that certain data units, e.g., physical layer convergence protocol (PLCP) service data units (PSDUs) or aggregated MAC protocol data units (A-MPDUs), may be input to the scrambler 410. The scrambler 410 may output the scrambled PSDUs to the shaping encoder 420, e.g., a variable-rate shaping encoder. Next, the shaping encoder 420 may output the type of bits, e.g., systematic bits and parity bits. As depicted in FIG. 4, the LDPC encoder 430 may be between the shaping encoder 420 and the QAM modulator 440, where the LDPC encoder 430 outputs the parity bits. The systematic bits and the parity bits may be input to the QAM modulator 440 as amplitude bits and sign bits, respectively. Finally, the QAM modulator 440 may output QAM symbols.

Additionally, some types of shaping encoders may map or assign a variable number of input bits to a fixed number of output bits. In some instances, the number of output bits may be selected to accommodate size limitations of an LDPC encoder input. Further, there may be methods to ensure an appropriate number of input bits is selected for the desired number of output bits. Also, the shaped bits may be grouped into uniform sized clusters, as depicted in FIG. 5A below.

FIG. 5A illustrates a diagram 500 of one example of a prefix encoding process. More specifically, FIG. 5A displays an example prefix encoding process for 256-QAM. As shown in FIG. 5A, diagram 500 includes input bits, output bits, an I/Q level of the bits, and probability (p) of each outcome. FIG. 5A discloses that the shaped output bits are grouped into uniformly sized clusters. For example, in the case of 256-QAM with the prefix coding in FIG. 5A, shaped bit stream '100101111100101xx . . . ' has the following inherent grouping: '100,101,111,110,010,1xx, . . . '

In order to keep the integrity of the shaped bits in FIG. 5A, i.e., achieve the desired constellation shaping, the grouped bit clusters may be preserved. In general, each cluster consists of a certain number of bits, e.g., (M−2) bits, where M is the order of modulation, e.g., M=8 for 256-QAM. When mapping to a modulation symbol, it may be necessary to use the original clusters of the shaped bit stream. For example, if the sequence of the example above is shifted by a certain amount, e.g., shifted by a single bit as shown in FIG. 5B, the constellation shaping may no longer be achieved.

FIG. 5B illustrates a diagram 550 of one example of a shifted bit sequence. More specifically, FIG. 5B displays an example bit shifting process that shifts a bit sequence by one (1) bit. As shown in FIG. 5B, diagram 550 shifts the bit sequence in FIG. 5A by a single bit. For example, the bit sequence 'xxx,100,101,111,110,010,1xx, . . . ' in FIG. 5A is shifted by one (1) bit to produce 'xx1,001,011,111,100,101, xx, . . . ' in FIG. 5B. As indicated above, the constellation shaping in FIG. 5A is no longer achieved due to the 1-bit shifting in FIG. 5B.

Some aspects of wireless communication may utilize channel interleaving, i.e., allocating contiguous portions of data across interleaved channels. Channel interleaving may increase a potential read bandwidth as requests for data may be made to each interleaved channel in an overlapped manner. In some instances, the systematic bits at the output of the channel encoder (e.g., an LDPC encoder) may have a desired distribution defined by the shaping code. Existing channel interleaver designs may apply to certain mapping principles, e.g., systematic bit-priority mapping based principles. Additionally, the row-to-column interleaving may break or interrupt the order of the shaped systematic bits. Thus, the channel interleaver output may break or interrupt the original integrity of the shaped bits in the bit stream.

Figure 6:
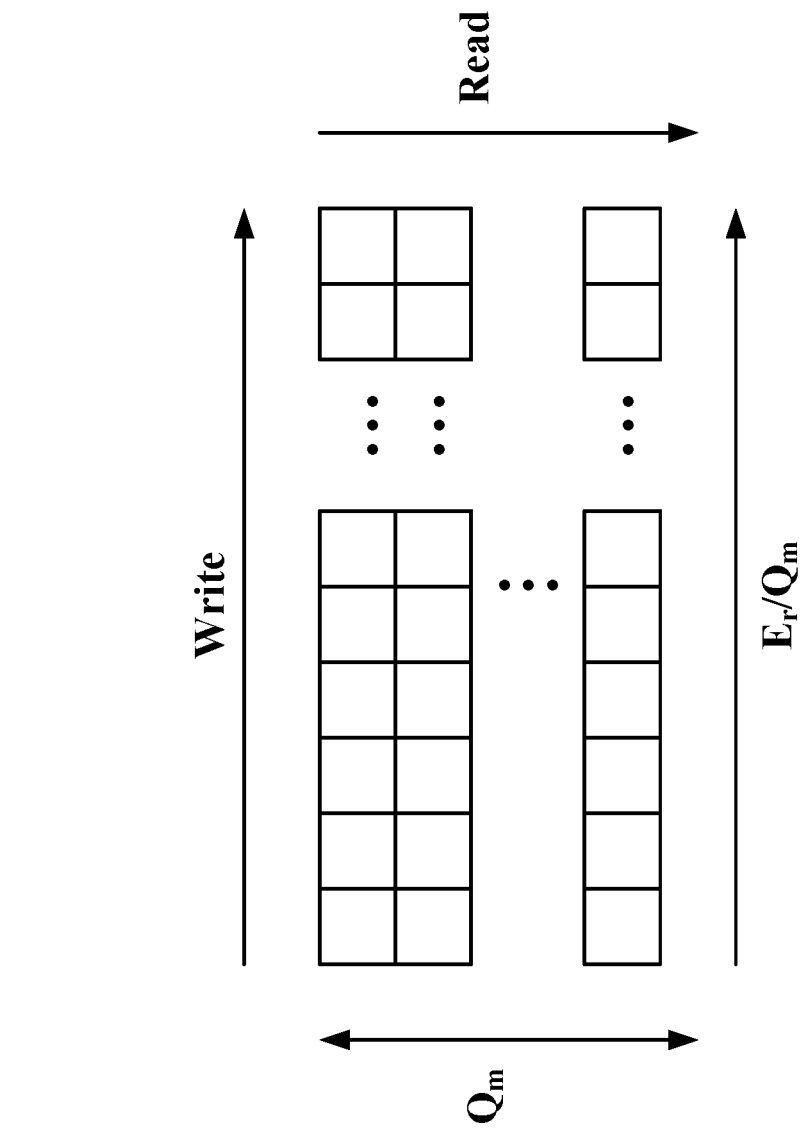
FIG. 6 is a diagram illustrating an example channel interleaving process.

FIG. 6 illustrates a diagram 600 of one example of a channel interleaving process. More specifically, diagram 600 in FIG. 6 displays a channel interleaving process for systematic bits at the output of a low density parity check (LDPC) encoder. As shown in FIG. 6, diagram 600 depicts a number of bits including a length of an input sequence ($E_r$) and a modulation order ($Q_m$). FIG. 6 also shows that the bits are written corresponding to the ratio of input sequence/modulation order ($E_r/Q_m$) and read corresponding to the modulation order ($Q_m$).

In some instances, systematic bits may be shaped, i.e., the order of the bits are arranged with a shaping encoder, and the parity bits may not be shaped. When a redundancy version (RV) of a circular buffer includes both types of bits, the bits-to-modulation-symbol mapping process may need to ensure that the clusters of the shaped systematic bits are maintained. Also, there may be multiple types of circular buffers with corresponding RVs. Two types of circular buffers and associated RVs are shown in FIGS. 7A and 7B.

Figure 7A:
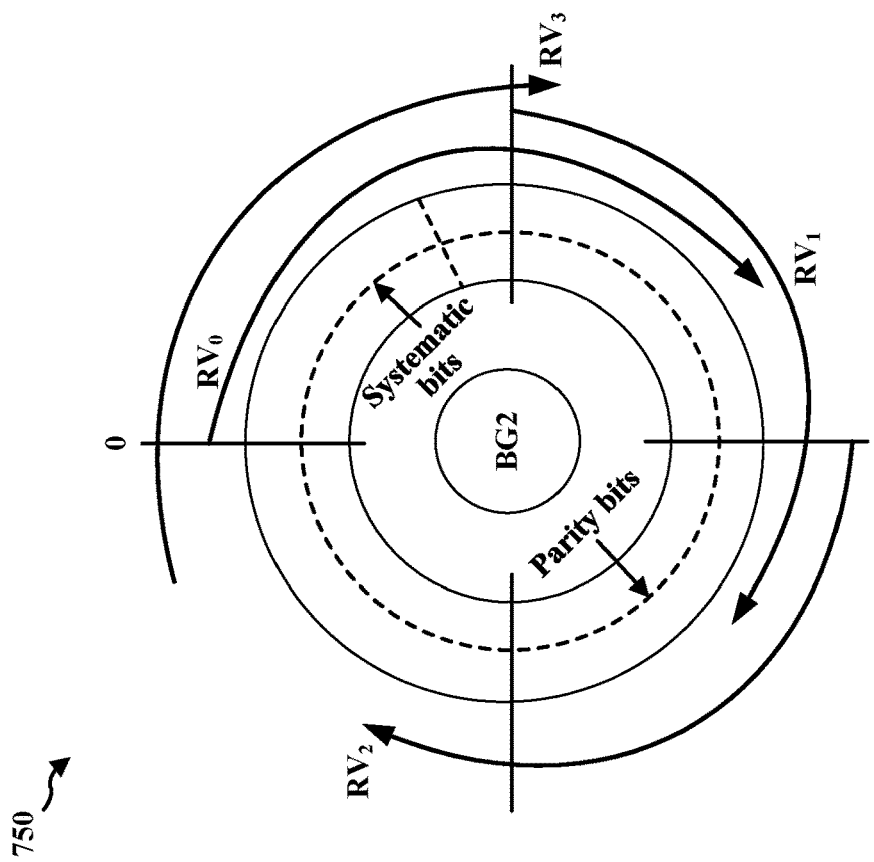
FIG. 7A is a diagram illustrating an example circular buffer.
Figure 7B:
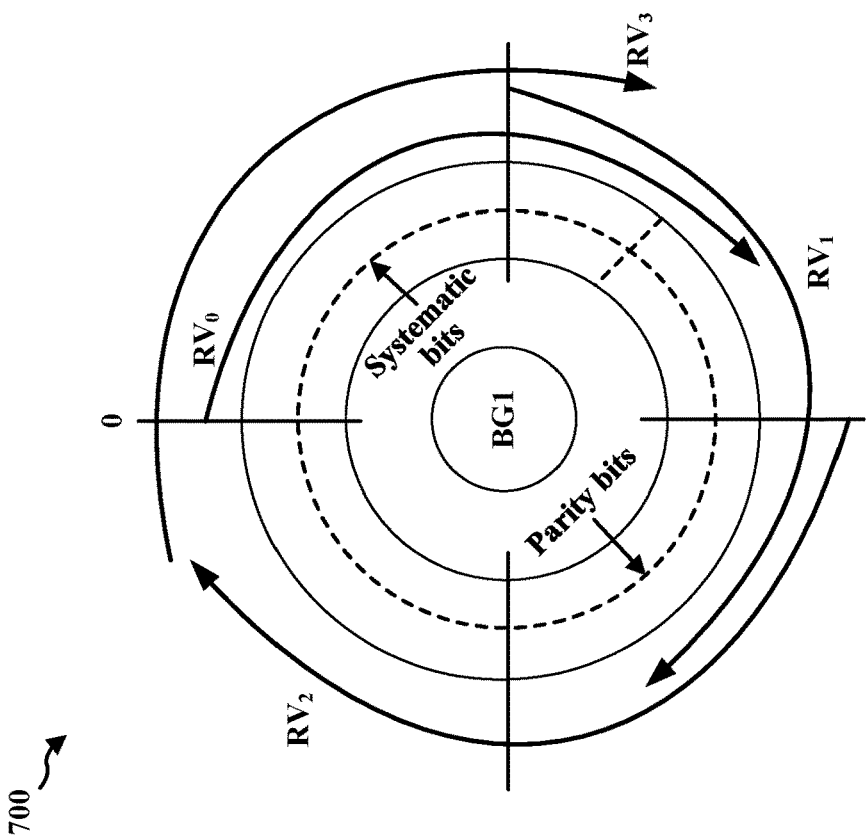
FIG. 7B is a diagram illustrating an example circular buffer.

FIGS. 7A and 7B illustrate diagrams 700 and 750, respectively, of example circular buffers. More specifically, FIGS. 7A and 7B display circular buffers with corresponding redundancy versions (RVs) including systematic bits and parity bits. As shown in FIG. 7A, diagram 700 is a circular buffer with four types of corresponding RVs, e.g., first RV (RV0), second RV (RV1), third RV (RV2), and fourth RV (RV2). Both systematic bits and parity bits are stored in the circular buffer in diagram 500. As shown in FIG. 7B, diagram 750 is also a circular buffer with four types of corresponding RVs, e.g., first RV (RV0), second RV (RV1), third RV (RV2), and fourth RV (RV2). Further, both systematic bits and parity bits are stored in the circular buffer in diagram 550. In FIGS. 7A and 7B, the RVs are shifted differently and there is a different amount of systematic bits compared to parity bits. For instance, there are more systematic bits stored in the circular buffer in FIG. 7A compared to the systematic bits stored in the circular buffer in FIG. 7B.

As indicated in FIGS. 7A and 7B, even without channel interleaving, the bits in a circular buffer may be sequentially read out and mapped to modulation symbols according to a modulation and coding scheme (MCS) configuration. This process may be easily achieved by a first RV (RV0), which begins with systematic bits. For other RVs, this may be more difficult, as there may be no way to preserve the integrity of the shaped bits. For example, when a second RV (RV1) is configured, although it starts from a systematic bit in the circular buffer, the systematic bit may not be the first bit of a cluster or group of shaped bits. Additionally, when a fourth RV (RV3) is configured, it may begin with parity bits in the circular buffer.

As indicated above, when the systematic bits are read, there may be no way to ensure that clusters of certain bits, e.g., systematic bits, are mapped to the desired modulation symbols. Accordingly, the mapping from channel-coded bits to modulation symbols may not preserve the shaped constellation. As such, it may be beneficial to ensure that clusters of bits are mapped to desired modulation symbols. Further, it may be beneficial to preserve a shaped constellation based on mapping from channel-coded bits to modulation symbols.

Aspects of the present disclosure may ensure that clusters of bits are mapped to desired modulation symbols. For instance, aspects of the present disclosure may preserve a shaped constellation based on mapping from channel-coded bits to modulation symbols. In order to preserve shaped constellations, aspects of the present disclosure may utilize probabilistic shaping. For example, aspects of the present disclosure may utilize rate matching and channel interleaving to preserve shaped constellations.

In some instances, aspects of the present disclosure may apply probabilistic shaping to high signal-to-interference plus noise (SINR) scenarios, where the effective coding rate is high. For instance, there may be no need to consider probabilistic shaping for scenarios with an effective low coding rate.

Aspects of the present disclosure may disable channel interleavers for probabilistic shaping. For instance, aspects of the present disclosure may include a static solution, such that when probabilistic shaping is enabled, the channel interleaving step is bypassed. Further, probabilistic shaping may be applied to high signal-to-noise ratio (SNR) additive white Gaussian noise (AWGN) channel scenarios, where the benefit of applying channel interleaving is negligible. Aspects of the present disclosure may also include more dynamic solutions, such as to enable or disable channel interleaving depending on the configured RV. For example, if RV1 or RV2 is utilized, channel interleaving may be enabled, and if RV0 or RV3 are utilized, channel interleaving may be disabled. This may be indicated by DCI that contains the scheduling information for the transmission or retransmission.

Additionally, aspects of the present disclosure may include separate interleavers for different types of bits, e.g., systematic bits and parity bits. For instance, a row-to-column interleaver may be applied at the output of the shaping encoder and another row-to-column interleaver may be applied at the LDPC output on the systematic bits. By doing so, LDPC may work on the interleaved bits to generate parity bits without changing the shaping. Also, another interleaver may be applied to parity bits generated from the LDPC encoder.

Aspects of the present disclosure may also define a procedure for RV-to-modulation symbol mapping. With probabilistic shaping, bits in an RV may be split into two categories: amplitude bits (i.e., bits representing the amplitude corresponding to modulation symbols) and sign bits (i.e., bits representing the sign corresponding to modulation symbols). Both the shaped bits (i.e., systematic bits) and the unshaped bits (i.e., parity bits) may be either amplitude bits or sign bits. Aspects of the present disclosure may establish two separate buffers that store amplitude bits and sign bits, respectively, i.e., an amplitude bit buffer and a sign bit buffer. For example, the bits may be read from the circular buffer according to RV configuration and then written into the amplitude bit buffers and sign bit buffers.

Figure 8B:
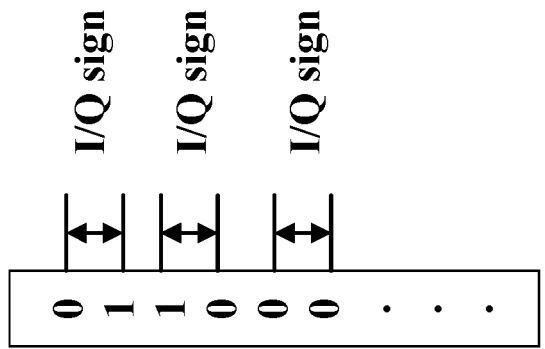
FIG. 8B is a diagram illustrating an example sign bit buffer.
Figure 8A:
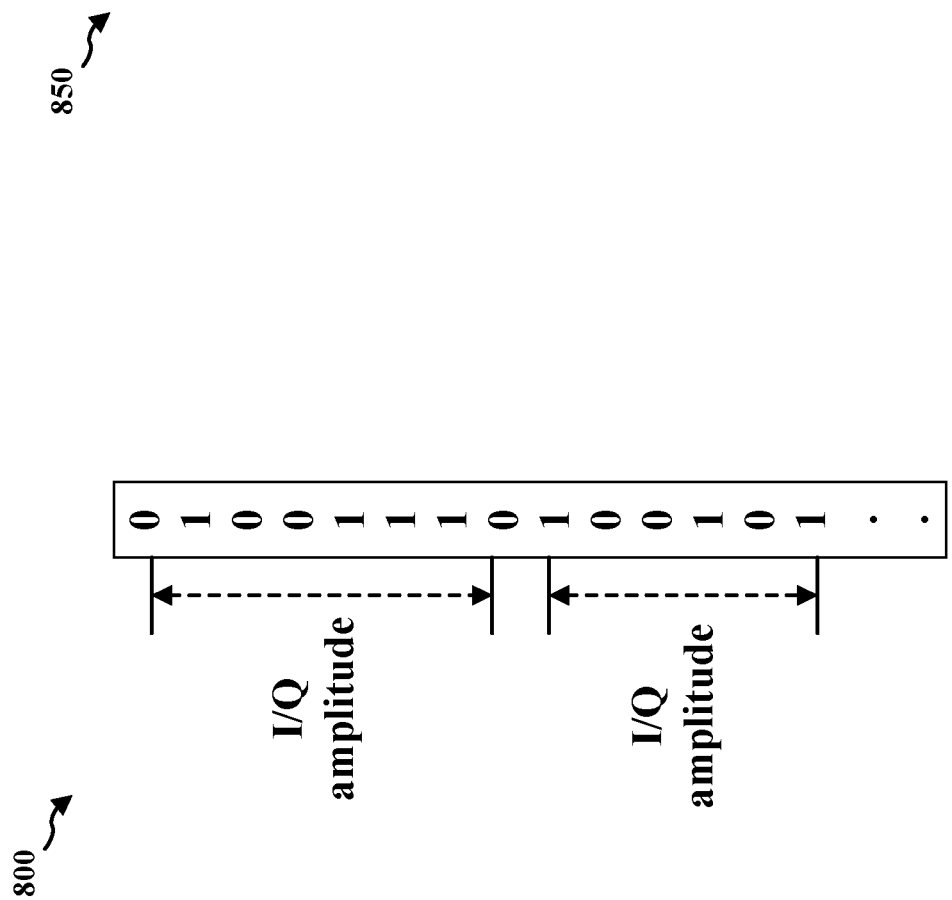
FIG. 8A is a diagram illustrating an example amplitude bit buffer.

FIGS. 8A and 8B illustrate diagrams 800 and 850, respectively, of example buffers according to aspects of the present disclosure. More specifically, FIGS. 8A and 8B display an amplitude bit buffer and a sign bit buffer, respectively. As shown in FIG. 8A, diagram 800 includes an amplitude bit buffer that stores a plurality of amplitude bits, e.g., I/Q amplitude bits. For example, the amplitude bit buffer in FIG. 8A corresponds to 1024-QAM, i.e., M=10. FIG. 8B displays diagram 850 including a sign bit buffer that stores a plurality of sign bits, e.g., I/Q sign bits. For example, the sign bit buffer in FIG. 8B corresponds to 1024-QAM, i.e., M=10.

Aspects of the present disclosure may include procedures to establish an amplitude bit buffer and a sign bit buffer. For instance, aspects of the present disclosure may read RV bits from a circular buffer and write into an amplitude bit buffer and a sign bit buffer. In order to establish an amplitude bit buffer and a sign bit buffer, aspects of the present disclosure may define a number of variables, such as: a modulation order (M), a number of modulation symbols ($N_{mod}$), a number of systematic bits in the RV ($n_{sys}$), a number of parity bits in the RV ($n_{par}$), a starting index of the systematic bits ($i_{sys}$) (e.g., $i_{sys}$=0 for RV0), a number of amplitude bits ($n_{amp}$) (e.g., $n_{amp}$=(M-2)$N_{mod}$), a number of sign bits ($n_{sgn}$) (e.g., $n_{sgn}$=2$N_{mod}$), and an offset applied to a starting index of the systematic bits ($i_{sys\_off}$).

In some instances, aspects of the present disclosure may determine $n_{sys}$, where $n_{sys}$ is a function of RV configuration, $N_{mod}$, and M. If $n_{sys}$=0, aspects of the present disclosure may fill the amplitude bit buffer and the sign bit buffer with parity bits sequentially, where the amplitude bit buffer is filled first. If $n_{sys}$≤(M-2)$N_{mod}$, if mod($i_{sys}$,(M-2))=0, $i_{sys\_off}$=0; else $i_{sys\_off}$=(M-2)-mod($i_{sys}$,(M-2)), where 'mod' is a modulo operation that returns the remainder or signed remainder of a division operation, i.e., after one number is divided by another number. Also, if $n_{sys}$≤(M-2)$N_{mod}$, aspects of the present disclosure may read from index ($i_{sys}$+$i_{sys\_off}$) of the systematic bits in the circular buffer and write into the amplitude bit buffer. This process may fill the amplitude bit buffer with $n_{sys}$−$i_{sys\_off}$ bits. After that, aspects of the present disclosure may write the $i_{sys\_off}$ number of systematic bits that are bypassed into the amplitude buffer. Aspects of the present disclosure may also fill the remaining portion of the amplitude buffer, followed by the sign bit buffer, with $n_{par}$ parity bits sequentially.

Additionally, if mod($i_{sys}$,(M-2))=0, $i_{sys\_off}$=0; else $i_{sys\_off}$=(M-2)-mod($i_{sys}$,(M-2)). Also, aspects of the present disclosure may read from index ($i_{sys}$+$i_{sys\_off}$) of the systematic bits in the circular buffer and write into the amplitude bit buffer until it is filled. Aspects of the present disclosure may also write the $i_{sys\_off}$ number of systematic bits that are bypassed into the sign bit buffer, followed by the remaining systematic bits and the parity bits. In some instances, the value of $i_{sys\_off}$ may be transferred to the UE, such as via piggyback DCI.

Aspects of the present disclosure may include many alternative ways to map the RV bits to modulation symbols while preserving the integrity of the shaped constellation. For instance, the order of how bits are written into the sign bit buffer may not be important and alternative procedures may be utilized. For example, when RV1 and RV2 are used, the original RV-to-modulation symbol mapping method may be used, as there are little to no shaped bits in these RVs. Moreover, this mapping may be semi-statically or dynamically configured via radio resource control (RRC) signaling, a medium access control (MAC) control element (MAC-CE), or downlink control information (DCI).

Figure 9:
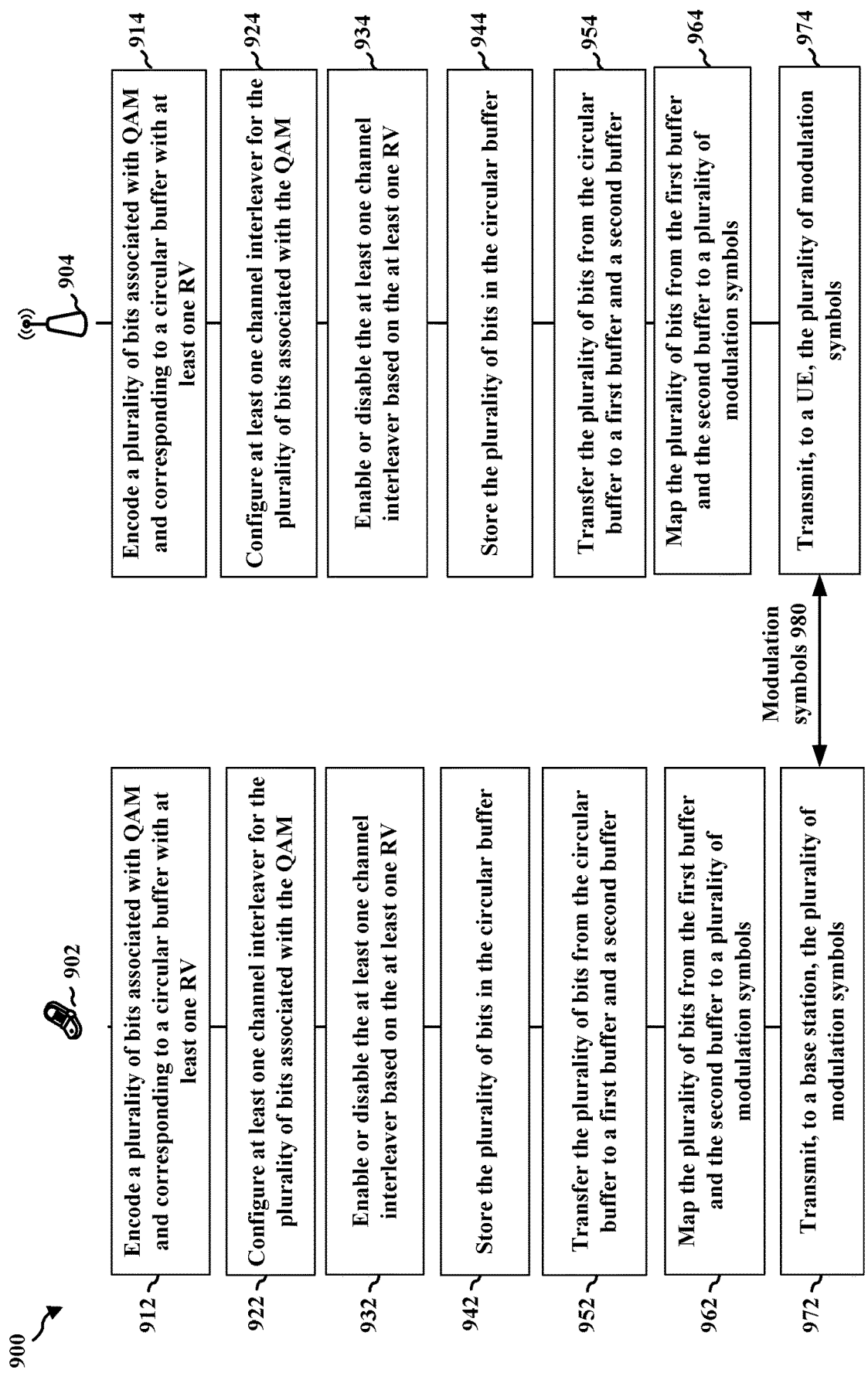
FIG. 9 is a diagram illustrating example communication between a UE and a base station.

FIG. 9 is a diagram 900 illustrating example communication between a UE 902 and a base station 904.

At 912, UE 902 may encode a plurality of bits associated with quadrature amplitude modulation (QAM), the plurality of bits corresponding to a circular buffer associated with at least one redundancy version (RV), the plurality of bits including a plurality of systematic bits. The plurality of bits may further include a plurality of parity bits. The plurality of bits may be encoded based on prefix encoding or a low density parity check (LDPC) encoder. If the plurality of bits is encoded based on the LDPC encoder, an output of the LDPC encoder may correspond to the plurality of bits including a plurality of parity bits. Also, the plurality of systematic bits may be associated with probabilistic shaping.

At 914, base station 904 may encode a plurality of bits associated with quadrature amplitude modulation (QAM), the plurality of bits corresponding to a circular buffer associated with at least one redundancy version (RV), the plurality of bits including a plurality of systematic bits.

At 922, UE 902 may configure at least one channel interleaver for the plurality of bits associated with the QAM. The at least one channel interleaver may include a first channel interleaver for a plurality of parity bits and a second channel interleaver for the plurality of systematic bits. Also, the at least one channel interleaver may include a first row-to-column interleaver and a second row-to-column interleaver. The first row-to-column interleaver may be associated with an output of a shaping encoder and the second row-to-column interleaver may be associated with a low density parity check (LDPC) output of the plurality of systematic bits.

At 924, base station 904 may configure at least one channel interleaver for the plurality of bits associated with the QAM.

At 932, UE 902 may enable or disable the at least one channel interleaver based on the at least one RV.

At 934, base station 904 may enable or disable the at least one channel interleaver based on the at least one RV.

At 942, UE 902 may store the plurality of bits in the circular buffer prior to transferring the plurality of bits to the first buffer and the second buffer.

At 944, base station 904 may store the plurality of bits in the circular buffer prior to transferring the plurality of bits to the first buffer and the second buffer.

At 952, UE 902 may transfer the plurality of bits from the circular buffer associated with the at least one RV to a first buffer and a second buffer. The plurality of bits may be transferred to the first buffer and the second buffer based on pseudocode. In some aspects, the UE 902 may read the plurality of bits from the circular buffer and write the plurality of bits to the first buffer and the second buffer. For instance, transferring the plurality of bits may include reading the plurality of bits from the circular buffer and writing the plurality of bits to the first buffer and the second buffer.

At 954, base station 904 may transfer the plurality of bits from the circular buffer associated with the at least one RV to a first buffer and a second buffer.

In some aspects, the first buffer may be an amplitude bit buffer and the second buffer may be a sign bit buffer. If a number of the plurality of systematic bits in the at least one RV ($n_{sys}$) is equal to zero, the amplitude bit buffer and the sign bit buffer may be filled sequentially with a plurality of parity bits of the plurality of bits, where the amplitude bit buffer may be filled prior to the sign bit buffer. If $n_{sys} \leq (M-2)N_{mod}$, and if $\mod(i_{sys}, (M-2))=0$, then $i_{sys\_off}=0$; else $i_{sys\_off}=(M-2)-\mod(i_{sys}, (M-2))$, where $n_{sys}$ is a number of the plurality of systematic bits in the at least one RV, M is a modulation order, $N_{mod}$ is a number of modulation symbols, $i_{sys}$ is a starting index of the plurality of systematic bits, and $i_{sys\_off}$ is an offset applied to the starting index of the plurality of systematic bits. If $\mod(i_{sys}, (M-2))=0$, then $i_{sys\_off}=0$; else $i_{sys\_off}=(M-2)-\mod(i_{sys}, (M-2))$, where $i_{sys}$ is a starting index of the plurality of systematic bits, M is a modulation order, and $i_{sys\_off}$ is an offset applied to the starting index of the plurality of systematic bits.

At 962, UE 902 may map the plurality of bits from the first buffer and the second buffer to a plurality of modulation symbols.

At 964, base station 904 may map the plurality of bits from the first buffer and the second buffer to a plurality of modulation symbols.

At 972, UE 902 may transmit, to a base station (e.g., base station 904), the plurality of modulation symbols (e.g., modulation symbols 980), where the plurality of modulation symbols is transmitted after the plurality of bits is mapped from the first buffer and the second buffer to the plurality of modulation symbols.

At 974, base station 904 may transmit, to a UE (e.g., UE 902), the plurality of modulation symbols (e.g., modulation symbols 980), where the plurality of modulation symbols is transmitted after the plurality of bits is mapped from the first buffer and the second buffer to the plurality of modulation symbols.

Figure 10:
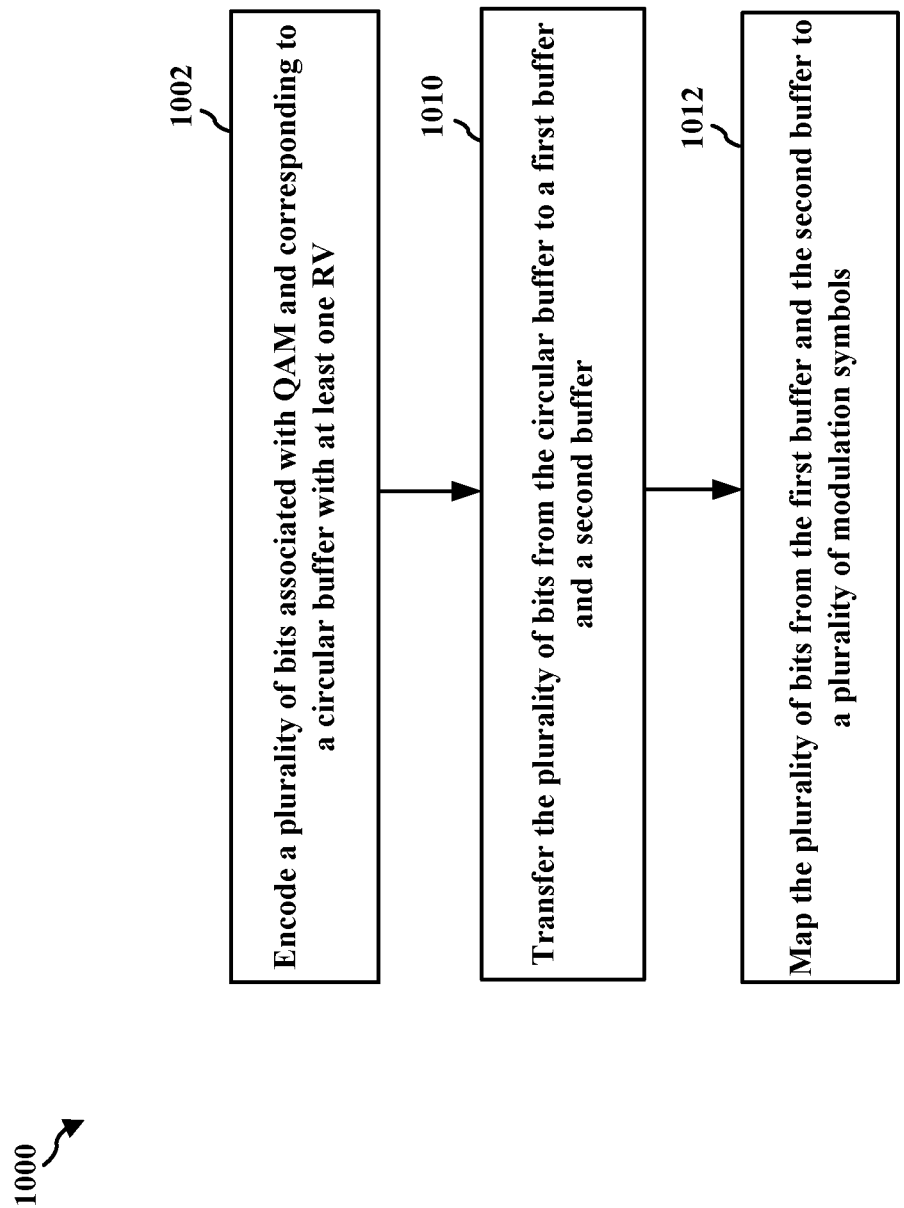
FIG. 10 is a flowchart of a method of wireless communication.

FIG. 10 is a flowchart 1000 of a method of wireless communication. The method may be performed by a UE or a component of a UE (e.g., the UE 104, 350, 902; the apparatus 1402). The methods described herein may provide a number of benefits, such as improving communication signaling, resource utilization, and/or power savings.

At 1002, the UE may encode a plurality of bits associated with quadrature amplitude modulation (QAM), the plurality of bits corresponding to a circular buffer associated with at least one redundancy version (RV), the plurality of bits including a plurality of systematic bits, as described in connection with the examples in FIGS. 4-9. For example, UE 902 may encode a plurality of bits associated with quadrature amplitude modulation (QAM), the plurality of bits corresponding to a circular buffer associated with at least one redundancy version (RV), the plurality of bits including a plurality of systematic bits, as described in connection with 912 in FIG. 9. Further, 1002 may be performed by determination component 1440 in FIG. 14. The plurality of bits may further include a plurality of parity bits. The plurality of bits may be encoded based on prefix encoding or a low density parity check (LDPC) encoder. If the plurality of bits is encoded based on the LDPC encoder, an output of the LDPC encoder may correspond to the plurality of bits including a plurality of parity bits. Also, the plurality of systematic bits may be associated with probabilistic shaping.

At 1010, the UE may transfer the plurality of bits from the circular buffer associated with the at least one RV to a first buffer and a second buffer, as described in connection with the examples in FIGS. 4-9. For example, UE 902 may transfer the plurality of bits from the circular buffer associated with the at least one RV to a first buffer and a second buffer, as described in connection with 952 in FIG. 9. Further, 1010 may be performed by determination component 1440 in FIG. 14. The plurality of bits may be transferred to the first buffer and the second buffer based on pseudocode. In some aspects, the UE 902 may read the plurality of bits from the circular buffer and write the plurality of bits to the first buffer and the second buffer. For instance, transferring the plurality of bits may include reading the plurality of bits from the circular buffer and writing the plurality of bits to the first buffer and the second buffer.

In some aspects, the first buffer may be an amplitude bit buffer and the second buffer may be a sign bit buffer. If a number of the plurality of systematic bits in the at least one RV ($n_{sys}$) is equal to zero, the amplitude bit buffer and the sign bit buffer may be filled sequentially with a plurality of parity bits of the plurality of bits, where the amplitude bit buffer may be filled prior to the sign bit buffer. If $n_{sys} \leq (M-2)N_{mod}$, and if $\mod(i_{sys}, (M-2))=0$, then $i_{sys\_off}=0$; else $i_{sys\_off}=(M-2)-\mod(i_{sys}, (M-2))$, where $n_{sys}$ is a number of the plurality of systematic bits in the at least one RV, M is a modulation order, $N_{mod}$ is a number of modulation symbols, $i_{sys}$ is a starting index of the plurality of systematic bits, and $i_{sys\_off}$ is an offset applied to the starting index of the plurality of systematic bits. If $\mod(i_{sys}, (M-2))=0$, then $i_{sys\_off}=0$; else $i_{sys\_off}=(M-2)-\mod(i_{sys}, (M-2))$, where $i_{sys}$ is a starting index of the plurality of systematic bits, M is a modulation order, and $i_{sys\_off}$ is an offset applied to the starting index of the plurality of systematic bits.

At 1012, the UE may map the plurality of bits from the first buffer and the second buffer to a plurality of modulation symbols, as described in connection with the examples in FIGS. 4-9. For example, UE 902 may map the plurality of bits from the first buffer and the second buffer to a plurality of modulation symbols, as described in connection with 962 in FIG. 9. Further, 1012 may be performed by determination component 1440 in FIG. 14.

Figure 11:
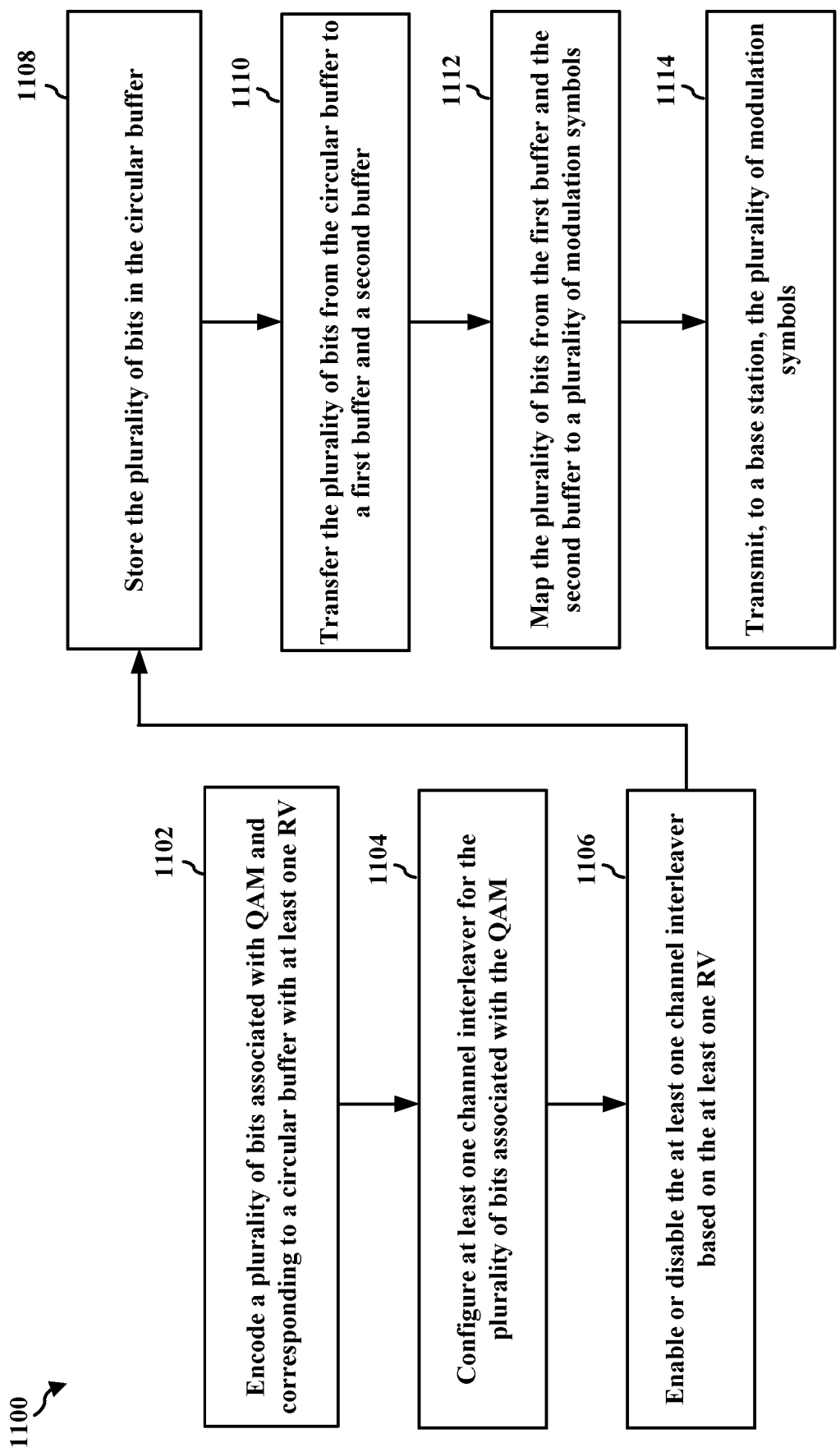
FIG. 11 is a flowchart of a method of wireless communication.

FIG. 11 is a flowchart 1100 of a method of wireless communication. The method may be performed by a UE or a component of a UE (e.g., the UE 104, 350, 902; the apparatus 1402). The methods described herein may provide a number of benefits, such as improving communication signaling, resource utilization, and/or power savings.

At 1102, the UE may encode a plurality of bits associated with quadrature amplitude modulation (QAM), the plurality of bits corresponding to a circular buffer associated with at least one redundancy version (RV), the plurality of bits including a plurality of systematic bits, as described in connection with the examples in FIGS. 4-9. For example, UE 902 may encode a plurality of bits associated with quadrature amplitude modulation (QAM), the plurality of bits corresponding to a circular buffer associated with at least one redundancy version (RV), the plurality of bits including a plurality of systematic bits, as described in connection with 912 in FIG. 9. Further, 1102 may be performed by determination component 1440 in FIG. 14. The plurality of bits may further include a plurality of parity bits. The plurality of bits may be encoded based on prefix encoding or a low density parity check (LDPC) encoder. If the plurality of bits is encoded based on the LDPC encoder, an output of the LDPC encoder may correspond to the plurality of bits including a plurality of parity bits. Also, the plurality of systematic bits may be associated with probabilistic shaping.

At 1104, the UE may configure at least one channel interleaver for the plurality of bits associated with the QAM, as described in connection with the examples in FIGS. 4-9. For example, UE 902 may configure at least one channel interleaver for the plurality of bits associated with the QAM, as described in connection with 922 in FIG. 9. Further, 1104 may be performed by determination component 1440 in FIG. 14. The at least one channel interleaver may include a first channel interleaver for a plurality of parity bits and a second channel interleaver for the plurality of systematic bits. Also, the at least one channel interleaver may include a first row-to-column interleaver and a second row-to-column interleaver. The first row-to-column interleaver may be associated with an output of a shaping encoder and the second row-to-column interleaver may be associated with a low density parity check (LDPC) output of the plurality of systematic bits.

At 1106, the UE may enable or disable the at least one channel interleaver based on the at least one RV, as described in connection with the examples in FIGS. 4-9. For example, UE 902 may enable or disable the at least one channel interleaver based on the at least one RV, as described in connection with 932 in FIG. 9. Further, 1106 may be performed by determination component 1440 in FIG. 14.

At 1108, the UE may store the plurality of bits in the circular buffer prior to transferring the plurality of bits to the first buffer and the second buffer, as described in connection with the examples in FIGS. 4-9. For example, UE 902 may store the plurality of bits in the circular buffer prior to transferring the plurality of bits to the first buffer and the second buffer, as described in connection with 942 in FIG. 9. Further, 1108 may be performed by determination component 1440 in FIG. 14.

At 1110, the UE may transfer the plurality of bits from the circular buffer associated with the at least one RV to a first buffer and a second buffer, as described in connection with the examples in FIGS. 4-9. For example, UE 902 may transfer the plurality of bits from the circular buffer associated with the at least one RV to a first buffer and a second buffer, as described in connection with 952 in FIG. 9. Further, 1110 may be performed by determination component 1440 in FIG. 14. The plurality of bits may be transferred to the first buffer and the second buffer based on pseudocode. In some aspects, the UE 902 may read the plurality of bits from the circular buffer and write the plurality of bits to the first buffer and the second buffer. For instance, transferring the plurality of bits may include reading the plurality of bits from the circular buffer and writing the plurality of bits to the first buffer and the second buffer.

In some aspects, the first buffer may be an amplitude bit buffer and the second buffer may be a sign bit buffer. If a number of the plurality of systematic bits in the at least one RV ($n_{sys}$) is equal to zero, the amplitude bit buffer and the sign bit buffer may be filled sequentially with a plurality of parity bits of the plurality of bits, where the amplitude bit buffer may be filled prior to the sign bit buffer. If $n_{sys} \leq (M-2)N_{mod}$, and if $\text{mod}(i_{sys}, (M-2))=0$, then $i_{sys\_off}=0$; else $i_{sys\_off}=(M-2)-\text{mod}(i_{sys}, (M-2))$, where $n_{sys}$ is a number of the plurality of systematic bits in the at least one RV, M is a modulation order, $N_{mod}$ is a number of modulation symbols, $i_{sys}$ is a starting index of the plurality of systematic bits, and $i_{sys\_off}$ is an offset applied to the starting index of the plurality of systematic bits. If $\text{mod}(i_{sys}, (M-2))=0$, then $i_{sys\_off}=0$; else $i_{sys\_off}=(M-2)-\text{mod}(i_{sys}, (M-2))$, where $i_{sys}$ is a starting index of the plurality of systematic bits, M is a modulation order, and $i_{sys\_off}$ is an offset applied to the starting index of the plurality of systematic bits.

At 1112, the UE may map the plurality of bits from the first buffer and the second buffer to a plurality of modulation symbols, as described in connection with the examples in FIGS. 4-9. For example, UE 902 may map the plurality of bits from the first buffer and the second buffer to a plurality of modulation symbols, as described in connection with 962 in FIG. 9. Further, 1112 may be performed by determination component 1440 in FIG. 14.

At 1114, the UE may transmit, to a base station, the plurality of modulation symbols, where the plurality of modulation symbols is transmitted after the plurality of bits is mapped from the first buffer and the second buffer to the plurality of modulation symbols, as described in connection with the examples in FIGS. 4-9. For example, UE 902 may transmit, to a base station, the plurality of modulation symbols, where the plurality of modulation symbols is transmitted after the plurality of bits is mapped from the first buffer and the second buffer to the plurality of modulation symbols, as described in connection with 972 in FIG. 9. Further, 1114 may be performed by determination component 1440 in FIG. 14.

Figure 12:
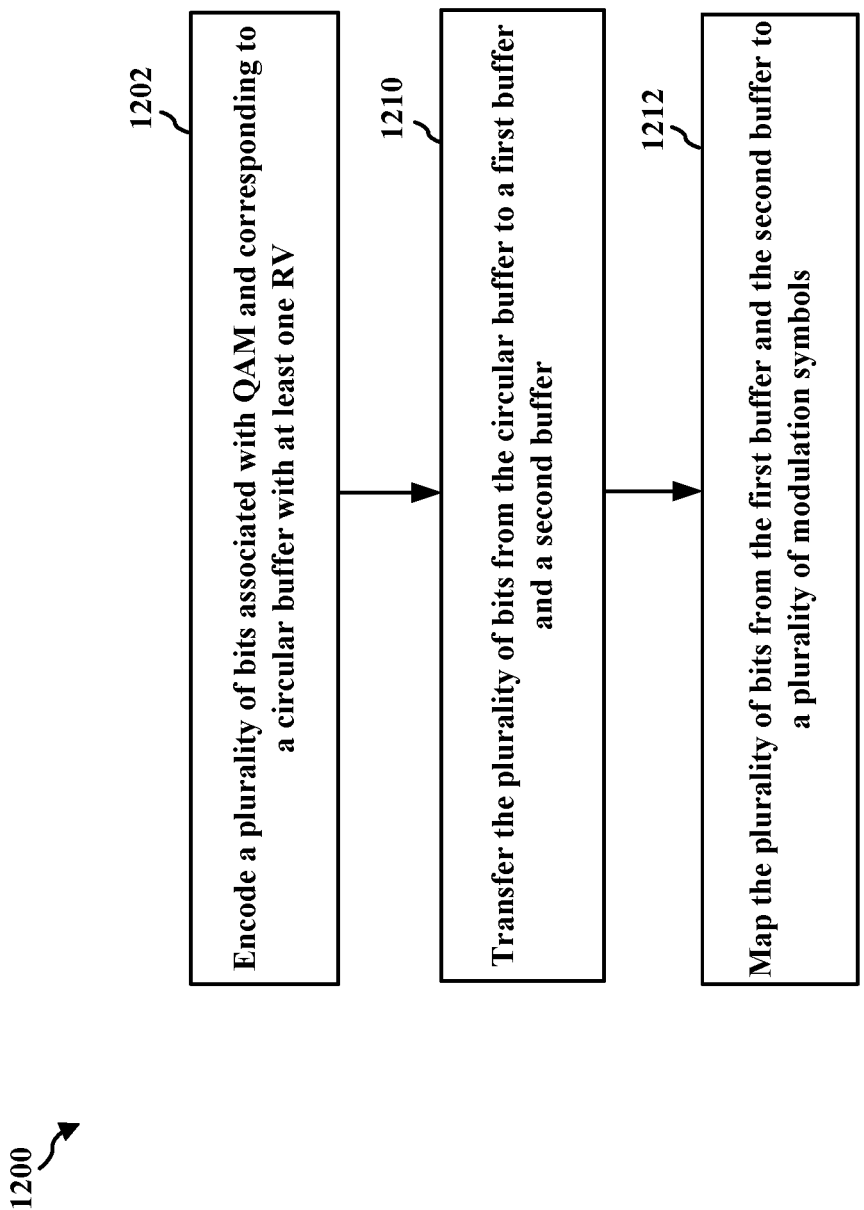
FIG. 12 is a flowchart of a method of wireless communication.

FIG. 12 is a flowchart 1200 of a method of wireless communication. The method may be performed by a base station or a component of a base station (e.g., the base station 102, 180, 310, 904; the apparatus 1502). The methods described herein may provide a number of benefits, such as improving communication signaling, resource utilization, and/or power savings.

At 1202, the base station may encode a plurality of bits associated with quadrature amplitude modulation (QAM), the plurality of bits corresponding to a circular buffer associated with at least one redundancy version (RV), the plurality of bits including a plurality of systematic bits, as described in connection with the examples in FIGS. 4-9. For example, base station 904 may encode a plurality of bits associated with quadrature amplitude modulation (QAM), the plurality of bits corresponding to a circular buffer associated with at least one redundancy version (RV), the plurality of bits including a plurality of systematic bits, as described in connection with 914 in FIG. 9. Further, 1202 may be performed by determination component 1540 in FIG. 15. The plurality of bits may further include a plurality of parity bits. The plurality of bits may be encoded based on prefix encoding or a low density parity check (LDPC) encoder. If the plurality of bits is encoded based on the LDPC encoder, an output of the LDPC encoder may correspond to the plurality of bits including a plurality of parity bits. Also, the plurality of systematic bits may be associated with probabilistic shaping.

At 1210, the base station may transfer the plurality of bits from the circular buffer associated with the at least one RV to a first buffer and a second buffer, as described in connection with the examples in FIGS. 4-9. For example, base station 904 may transfer the plurality of bits from the circular buffer associated with the at least one RV to a first buffer and a second buffer, as described in connection with 954 in FIG. 9. Further, 1210 may be performed by determination component 1540 in FIG. 15. The plurality of bits may be transferred to the first buffer and the second buffer based on pseudocode. In some aspects, the UE 902 may read the plurality of bits from the circular buffer and write the plurality of bits to the first buffer and the second buffer. For instance, transferring the plurality of bits may include reading the plurality of bits from the circular buffer and writing the plurality of bits to the first buffer and the second buffer.

In some aspects, the first buffer may be an amplitude bit buffer and the second buffer may be a sign bit buffer. If a number of the plurality of systematic bits in the at least one RV ($n_{sys}$) is equal to zero, the amplitude bit buffer and the sign bit buffer may be filled sequentially with a plurality of parity bits of the plurality of bits, where the amplitude bit buffer may be filled prior to the sign bit buffer. If $n_{sys} \leq (M-2)N_{mod}$, and if $\mod(i_{sys}, (M-2))=0$, then $i_{sys\_off}=0$; else $i_{sys\_off}=(M-2)-\mod(i_{sys}, (M-2))$, where $n_{sys}$ is a number of the plurality of systematic bits in the at least one RV, M is a modulation order, $N_{mod}$ is a number of modulation symbols, $i_{sys}$ is a starting index of the plurality of systematic bits, and $i_{sys\_off}$ is an offset applied to the starting index of the plurality of systematic bits. If $\mod(i_{sys}, (M-2))=0$, then $i_{sys\_off}=0$; else $i_{sys\_off}=(M-2)-\mod(i_{sys}, (M-2))$, where $i_{sys}$ is a starting index of the plurality of systematic bits, M is a modulation order, and $i_{sys\_off}$ is an offset applied to the starting index of the plurality of systematic bits.

At 1212, the base station may map the plurality of bits from the first buffer and the second buffer to a plurality of modulation symbols, as described in connection with the examples in FIGS. 4-9. For example, base station 904 may map the plurality of bits from the first buffer and the second buffer to a plurality of modulation symbols, as described in connection with 964 in FIG. 9. Further, 1212 may be performed by determination component 1540 in FIG. 15.

Figure 13:
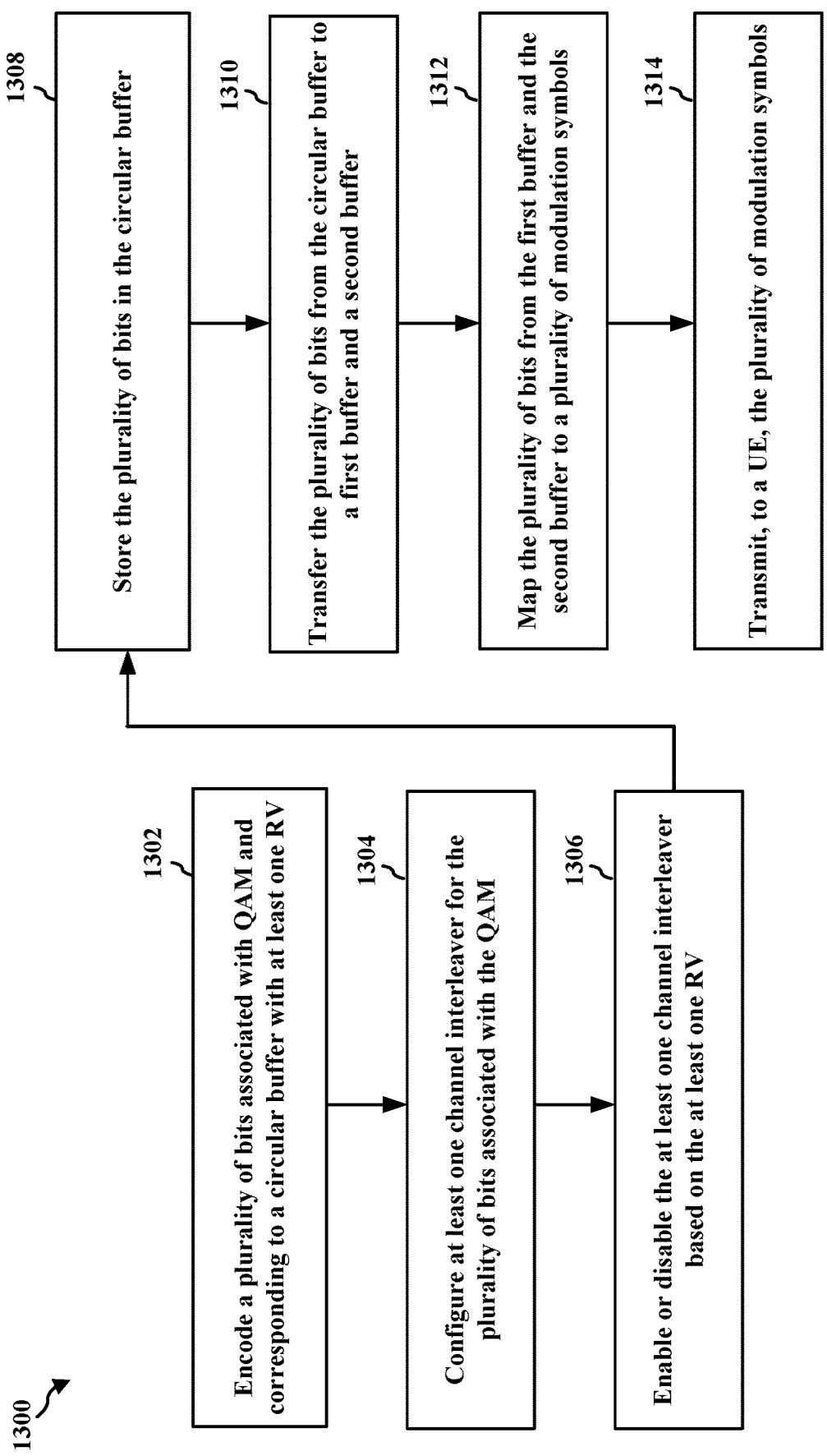
FIG. 13 is a flowchart of a method of wireless communication.

FIG. 13 is a flowchart 1300 of a method of wireless communication. The method may be performed by a base station or a component of a base station (e.g., the base station 102, 180, 310, 904; the apparatus 1502). The methods described herein may provide a number of benefits, such as improving communication signaling, resource utilization, and/or power savings.

At 1302, the base station may encode a plurality of bits associated with quadrature amplitude modulation (QAM), the plurality of bits corresponding to a circular buffer associated with at least one redundancy version (RV), the plurality of bits including a plurality of systematic bits, as described in connection with the examples in FIGS. 4-9. For example, base station 904 may encode a plurality of bits associated with quadrature amplitude modulation (QAM), the plurality of bits corresponding to a circular buffer associated with at least one redundancy version (RV), the plurality of bits including a plurality of systematic bits, as described in connection with 914 in FIG. 9. Further, 1302 may be performed by determination component 1540 in FIG. 15. The plurality of bits may further include a plurality of parity bits. The plurality of bits may be encoded based on prefix encoding or a low density parity check (LDPC) encoder. If the plurality of bits is encoded based on the LDPC encoder, an output of the LDPC encoder may correspond to the plurality of bits including a plurality of parity bits. Also, the plurality of systematic bits may be associated with probabilistic shaping.

At 1304, the base station may configure at least one channel interleaver for the plurality of bits associated with the QAM, as described in connection with the examples in FIGS. 4-9. For example, base station 904 may configure at least one channel interleaver for the plurality of bits associated with the QAM, as described in connection with 924 in FIG. 9. Further, 1304 may be performed by determination component 1540 in FIG. 15. The at least one channel interleaver may include a first channel interleaver for a plurality of parity bits and a second channel interleaver for the plurality of systematic bits. Also, the at least one channel interleaver may include a first row-to-column interleaver and a second row-to-column interleaver. The first row-to-column interleaver may be associated with an output of a shaping encoder and the second row-to-column interleaver may be associated with a low density parity check (LDPC) output of the plurality of systematic bits.

At 1306, the base station may enable or disable the at least one channel interleaver based on the at least one RV, as described in connection with the examples in FIGS. 4-9. For example, base station 904 may enable or disable the at least one channel interleaver based on the at least one RV, as described in connection with 934 in FIG. 9. Further, 1306 may be performed by determination component 1540 in FIG. 15.

At 1308, the base station may store the plurality of bits in the circular buffer prior to transferring the plurality of bits to the first buffer and the second buffer, as described in connection with the examples in FIGS. 4-9. For example, base station 904 may store the plurality of bits in the circular buffer prior to transferring the plurality of bits to the first buffer and the second buffer, as described in connection with 944 in FIG. 9. Further, 1308 may be performed by determination component 1540 in FIG. 15.

At 1310, the base station may transfer the plurality of bits from the circular buffer associated with the at least one RV to a first buffer and a second buffer, as described in connection with the examples in FIGS. 4-9. For example, base station 904 may transfer the plurality of bits from the circular buffer associated with the at least one RV to a first buffer and a second buffer, as described in connection with 954 in FIG. 9. Further, 1310 may be performed by determination component 1540 in FIG. 15. The plurality of bits may be transferred to the first buffer and the second buffer based on pseudocode. In some aspects, the UE 902 may read the plurality of bits from the circular buffer and write the plurality of bits to the first buffer and the second buffer. For instance, transferring the plurality of bits may include reading the plurality of bits from the circular buffer and writing the plurality of bits to the first buffer and the second buffer.

In some aspects, the first buffer may be an amplitude bit buffer and the second buffer may be a sign bit buffer. If a number of the plurality of systematic bits in the at least one RV ($n_{sys}$) is equal to zero, the amplitude bit buffer and the sign bit buffer may be filled sequentially with a plurality of parity bits of the plurality of bits, where the amplitude bit buffer may be filled prior to the sign bit buffer. If $n_{sys} \leq (M-2)N_{mod}$, and if $\mod(i_{sys}, (M-2))=0$, then $i_{sys\_off}=0$; else $i_{sys\_off}=(M-2)-\mod(i_{sys}, (M-2))$, where $n_{sys}$ is a number of the plurality of systematic bits in the at least one RV, M is a modulation order, $N_{mod}$ is a number of modulation symbols, $i_{sys}$ is a starting index of the plurality of systematic bits, and $i_{sys\_off}$ is an offset applied to the starting index of the plurality of systematic bits. If $\mod(i_{sys}, (M-2))=0$, then $i_{sys\_off}=0$; else $i_{sys\_off}=(M-2)-\mod(i_{sys}, (M-2))$, where $i_{sys}$ is a starting index of the plurality of systematic bits, M is a modulation order, and $i_{sys\_off}$ is an offset applied to the starting index of the plurality of systematic bits.

At 1312, the base station may map the plurality of bits from the first buffer and the second buffer to a plurality of modulation symbols, as described in connection with the examples in FIGS. 4-9. For example, base station 904 may map the plurality of bits from the first buffer and the second buffer to a plurality of modulation symbols, as described in connection with 964 in FIG. 9. Further, 1312 may be performed by determination component 1540 in FIG. 15.

At 1314, the base station may transmit, to a UE, the plurality of modulation symbols, where the plurality of modulation symbols is transmitted after the plurality of bits is mapped from the first buffer and the second buffer to the plurality of modulation symbols, as described in connection with the examples in FIGS. 4-9. For example, base station 904 may transmit, to a UE, the plurality of modulation symbols, where the plurality of modulation symbols is transmitted after the plurality of bits is mapped from the first buffer and the second buffer to the plurality of modulation symbols, as described in connection with 974 in FIG. 9. Further, 1314 may be performed by determination component 1540 in FIG. 15.

Figure 14:
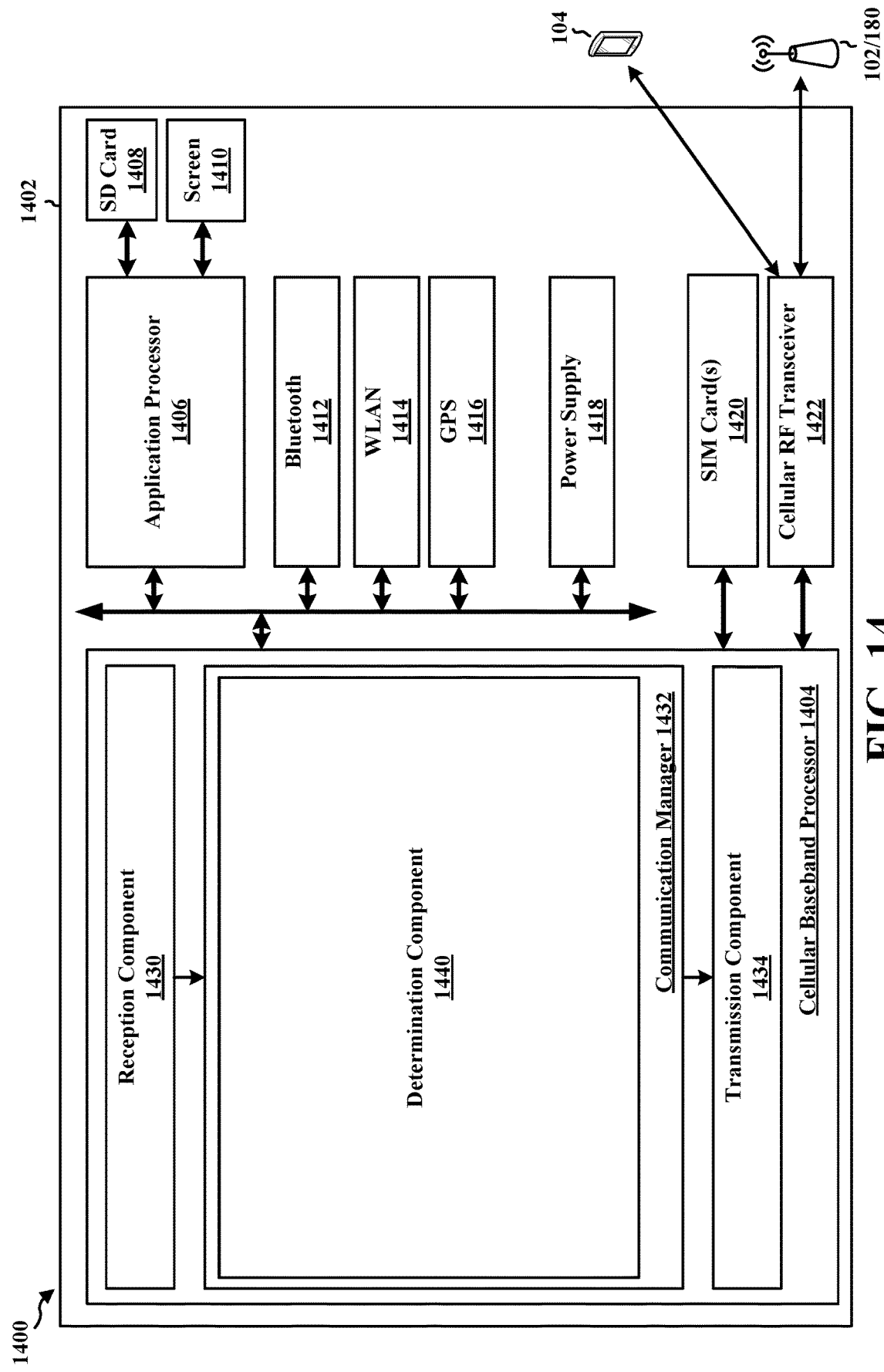
FIG. 14 is a diagram illustrating an example of a hardware implementation for an example apparatus.

FIG. 14 is a diagram 1400 illustrating an example of a hardware implementation for an apparatus 1402. The apparatus 1402 may be a UE, a component of a UE, or may implement UE functionality. In some aspects, the apparatus 1402 may include a cellular baseband processor 1404 (also referred to as a modem) coupled to a cellular RF transceiver 1422. In some aspects, the apparatus 1402 may further include one or more subscriber identity modules (SIM) cards 1420, an application processor 1406 coupled to a secure digital (SD) card 1408 and a screen 1410, a Bluetooth module 1412, a wireless local area network (WLAN) module 1414, a Global Positioning System (GPS) module 1416, or a power supply 1418. The cellular baseband processor 1404 communicates through the cellular RF transceiver 1422 with the UE 104 and/or BS 102/180. The cellular baseband processor 1404 may include a computer-readable medium/memory. The computer-readable medium/memory may be non-transitory. The cellular baseband processor 1404 is responsible for general processing, including the execution of software stored on the computer-readable medium/memory. The software, when executed by the cellular baseband processor 1404, causes the cellular baseband processor 1404 to perform the various functions described supra. The computer-readable medium/memory may also be used for storing data that is manipulated by the cellular baseband processor 1404 when executing software. The cellular baseband processor 1404 further includes a reception component 1430, a communication manager 1432, and a transmission component 1434. The communication manager 1432 includes the one or more illustrated components. The components within the communication manager 1432 may be stored in the computer-readable medium/memory and/or configured as hardware within the cellular baseband processor 1404. The cellular baseband processor 1404 may be a component of the UE 350 and may include the memory 360 and/or at least one of the TX processor 368, the RX processor 356, and the controller/processor 359. In one configuration, the apparatus 1402 may be a modem chip and include just the baseband processor 1404, and in another configuration, the apparatus 1402 may be the entire UE (e.g., see 350 of FIG. 3) and include the additional modules of the apparatus 1402.

The communication manager 1432 includes a determination component 1440 that is configured to encode a plurality of bits associated with quadrature amplitude modulation (QAM), the plurality of bits corresponding to a circular buffer associated with at least one redundancy version (RV), the plurality of bits including a plurality of systematic bits, e.g., as described in connection with step 1102 above. Determination component 1440 may also be configured to configure at least one channel interleaver for the plurality of bits associated with the QAM, e.g., as described in connection with step 1104 above. Determination component 1440 may also be configured to enable or disable the at least one channel interleaver based on the at least one RV, e.g., as described in connection with step 1106 above. Determination component 1440 may also be configured to store the plurality of bits in the circular buffer prior to transferring the plurality of bits to the first buffer and the second buffer, e.g., as described in connection with step 1108 above. Determination component 1440 may also be configured to transfer the plurality of bits from the circular buffer associated with the at least one RV to a first buffer and a second buffer, e.g., as described in connection with step 1110 above. Determination component 1440 may also be configured to map the plurality of bits from the first buffer and the second buffer to a plurality of modulation symbols, e.g., as described in connection with step 1112 above. Determination component 1440 may also be configured to transmit, to a base station, the plurality of modulation symbols, where the plurality of modulation symbols is transmitted after the plurality of bits is mapped from the first buffer and the second buffer to the plurality of modulation symbols, e.g., as described in connection with step 1114 above.

The apparatus may include additional components that perform each of the blocks of the algorithm in the flowcharts of FIGS. 9-11. As such, each block in the flowcharts of FIGS. 9-11 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

As shown, the apparatus 1402 may include a variety of components configured for various functions. In one configuration, the apparatus 1402, and in particular the cellular baseband processor 1404, includes means for encoding a plurality of bits associated with quadrature amplitude modulation (QAM), the plurality of bits corresponding to a circular buffer associated with at least one redundancy version (RV), the plurality of bits including a plurality of systematic bits; means for configuring at least one channel interleaver for the plurality of bits associated with the QAM; means for enabling or means for disabling the at least one channel interleaver based on the at least one RV; means for storing the plurality of bits in the circular buffer prior to transferring the plurality of bits to the first buffer and the second buffer; means for transferring the plurality of bits from the circular buffer associated with the at least one RV to a first buffer and a second buffer; means for mapping the plurality of bits from the first buffer and the second buffer to a plurality of modulation symbols; and means for transmitting, to a base station, the plurality of modulation symbols, where the plurality of modulation symbols is transmitted after the plurality of bits is mapped from the first buffer and the second buffer to the plurality of modulation symbols. The means may be one or more of the components of the apparatus 1402 configured to perform the functions recited by the means. As described supra, the apparatus 1402 may include the TX Processor 368, the RX Processor 356, and the controller/processor 359. As such, in one configuration, the means may be the TX Processor 368, the RX Processor 356, and the controller/processor 359 configured to perform the functions recited by the means.

Figure 15:
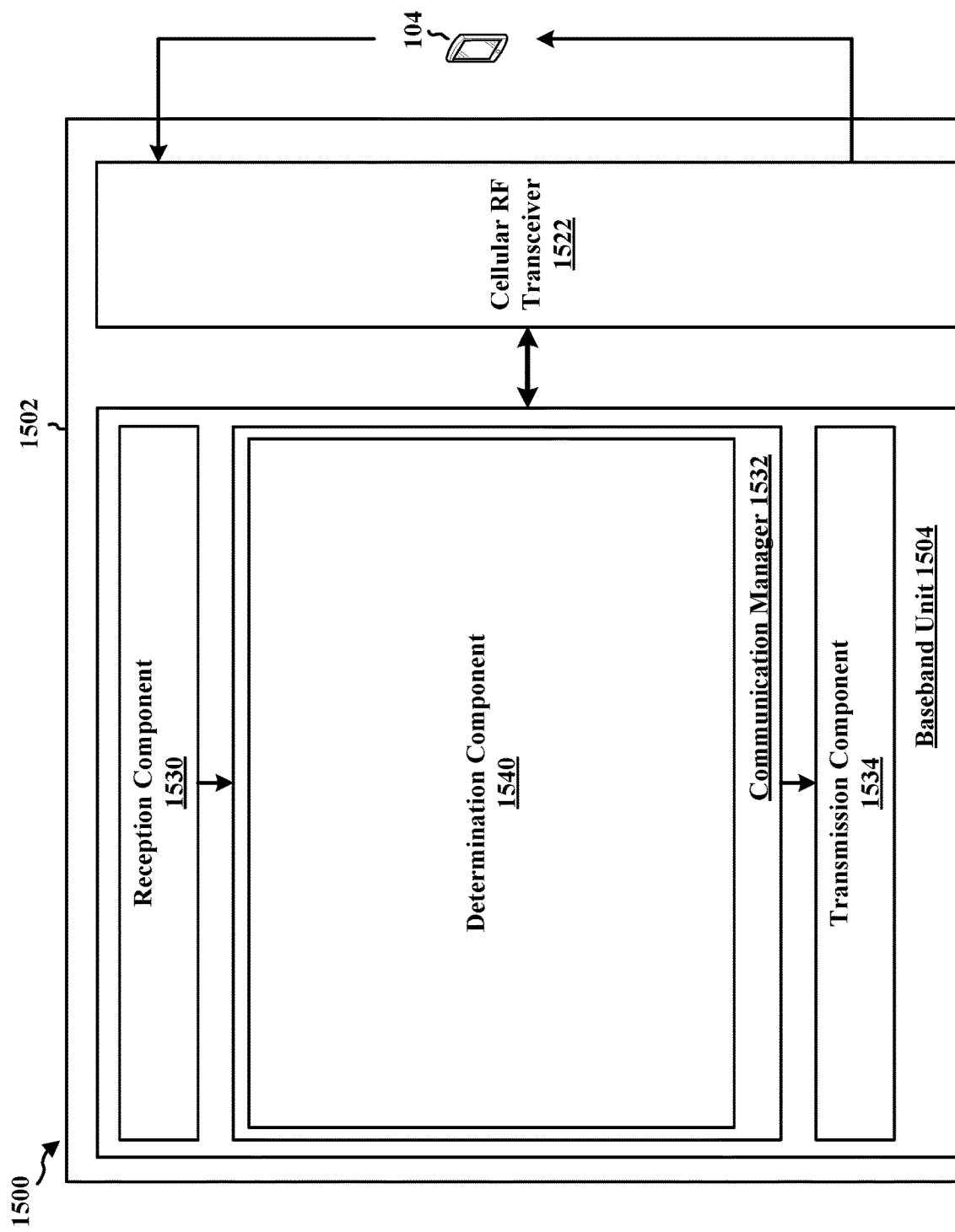
FIG. 15 is a diagram illustrating an example of a hardware implementation for an example apparatus.

FIG. 15 is a diagram 1500 illustrating an example of a hardware implementation for an apparatus 1502. The apparatus 1502 may be a base station, a component of a base station, or may implement base station functionality. In some aspects, the apparatus 1502 may include a baseband unit 1504. The baseband unit 1504 may communicate through a cellular RF transceiver 1522 with the UE 104. The baseband unit 1504 may include a computer-readable medium/memory. The baseband unit 1504 is responsible for general processing, including the execution of software stored on the computer-readable medium/memory. The software, when executed by the baseband unit 1504, causes the baseband unit 1504 to perform the various functions described supra. The computer-readable medium/memory may also be used for storing data that is manipulated by the baseband unit 1504 when executing software. The baseband unit 1504 further includes a reception component 1530, a communication manager 1532, and a transmission component 1534. The communication manager 1532 includes the one or more illustrated components. The components within the communication manager 1532 may be stored in the computer-readable medium/memory and/or configured as hardware within the baseband unit 1504. The baseband unit 1504 may be a component of the base station 310 and may include the memory 376 and/or at least one of the TX processor 316, the RX processor 370, and the controller/processor 375.

The communication manager 1532 includes a determination component 1540 that is configured to encode a plurality of bits associated with quadrature amplitude modulation (QAM), the plurality of bits corresponding to a circular buffer associated with at least one redundancy version (RV), the plurality of bits including a plurality of systematic bits, e.g., as described in connection with step 1302 above. Determination component 1540 may also be configured to configure at least one channel interleaver for the plurality of bits associated with the QAM, e.g., as described in connection with step 1304 above. Determination component 1540 may also be configured to enable or disable the at least one channel interleaver based on the at least one RV, e.g., as described in connection with step 1306 above. Determination component 1540 may also be configured to store the plurality of bits in the circular buffer prior to transferring the plurality of bits to the first buffer and the second buffer, e.g., as described in connection with step 1308 above. Determination component 1540 may also be configured to transfer the plurality of bits from the circular buffer associated with the at least one RV to a first buffer and a second buffer, e.g., as described in connection with step 1310 above. Determination component 1540 may also be configured to map the plurality of bits from the first buffer and the second buffer to a plurality of modulation symbols, e.g., as described in connection with step 1312 above. Determination component 1540 may also be configured to transmit, to a user equipment (UE), the plurality of modulation symbols, where the plurality of modulation symbols is transmitted after the plurality of bits is mapped from the first buffer and the second buffer to the plurality of modulation symbols, e.g., as described in connection with step 1314 above.

The apparatus may include additional components that perform each of the blocks of the algorithm in the flowcharts of FIGS. 9, 12, and 13. As such, each block in the flowcharts of FIGS. 9, 12, and 13 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

As shown, the apparatus 1502 may include a variety of components configured for various functions. In one configuration, the apparatus 1502, and in particular the baseband unit 1504, includes means for encoding a plurality of bits associated with quadrature amplitude modulation (QAM), the plurality of bits corresponding to a circular buffer associated with at least one redundancy version (RV), the plurality of bits including a plurality of systematic bits; means for configuring at least one channel interleaver for the plurality of bits associated with the QAM; means for enabling or means for disabling the at least one channel interleaver based on the at least one RV; means for storing the plurality of bits in the circular buffer prior to transferring the plurality of bits to the first buffer and the second buffer; means for transferring the plurality of bits from the circular buffer associated with the at least one RV to a first buffer and a second buffer; means for mapping the plurality of bits from the first buffer and the second buffer to a plurality of modulation symbols; and means for transmitting, to a user equipment (UE), the plurality of modulation symbols, where the plurality of modulation symbols is transmitted after the plurality of bits is mapped from the first buffer and the second buffer to the plurality of modulation symbols. The means may be one or more of the components of the apparatus 1502 configured to perform the functions recited by the means. As described supra, the apparatus 1502 may include the TX Processor 316, the RX Processor 370, and the controller/processor 375. As such, in one configuration, the means may be the TX Processor 316, the RX Processor 370, and the controller/processor 375 configured to perform the functions recited by the means.

It is understood that the specific order or hierarchy of blocks in the processes/flowcharts disclosed is an illustration of example approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Terms such as "if," "when," and "while" should be interpreted to mean "under the condition that" rather than imply an immediate temporal relationship or reaction. That is, these phrases, e.g., "when," do not imply an immediate action in response to or during the occurrence of an action, but simply imply that if a condition is met then an action will occur, but without requiring a specific or immediate time constraint for the action to occur. The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

The following aspects are illustrative only and may be combined with other aspects or teachings described herein, without limitation.

Aspect 1 is an apparatus for wireless communication at a UE including at least one processor coupled to a memory and configured to: encode a plurality of bits associated with quadrature amplitude modulation (QAM), the plurality of bits corresponding to a circular buffer associated with at least one redundancy version (RV), the plurality of bits including a plurality of systematic bits; transfer the plurality of bits from the circular buffer associated with the at least one RV to a first buffer and a second buffer; and map the plurality of bits from the first buffer and the second buffer to a plurality of modulation symbols.

Aspect 2 is the apparatus of aspect 1, where the at least one processor is further configured to: transmit, to a base station, the plurality of modulation symbols, where the plurality of modulation symbols is transmitted after the plurality of bits is mapped from the first buffer and the second buffer to the plurality of modulation symbols.

Aspect 3 is the apparatus of any of aspects 1 and 2, where the at least one processor is further configured to: configure at least one channel interleaver for the plurality of bits associated with the QAM.

Aspect 4 is the apparatus of any of aspects 1 to 3, where the at least one channel interleaver includes a first channel interleaver for a plurality of parity bits and a second channel interleaver for the plurality of systematic bits.

Aspect 5 is the apparatus of any of aspects 1 to 4, where the at least one channel interleaver includes a first row-to-column interleaver and a second row-to-column interleaver.

Aspect 6 is the apparatus of any of aspects 1 to 5, where the first row-to-column interleaver is associated with an output of a shaping encoder and the second row-to-column interleaver is associated with a low density parity check (LDPC) output of the plurality of systematic bits.

Aspect 7 is the apparatus of any of aspects 1 to 6, where the at least one processor is further configured to: enable or disable the at least one channel interleaver based on the at least one RV.

Aspect 8 is the apparatus of any of aspects 1 to 7, where transferring the plurality of bits includes: reading the plurality of bits from the circular buffer and writing the plurality of bits to the first buffer and the second buffer.

Aspect 9 is the apparatus of any of aspects 1 to 8, where the plurality of bits further includes a plurality of parity bits.

Aspect 10 is the apparatus of any of aspects 1 to 9, where the first buffer is an amplitude bit buffer and the second buffer is a sign bit buffer.

Aspect 11 is the apparatus of any of aspects 1 to 10, where if a number of the plurality of systematic bits in the at least one RV ($n_{sys}$) is equal to zero, the amplitude bit buffer and the sign bit buffer are filled sequentially with a plurality of parity bits of the plurality of bits, where the amplitude bit buffer is filled prior to the sign bit buffer.

Aspect 12 is the apparatus of any of aspects 1 to 11, where if $n_{sys} \leq (M-2)N_{mod}$, and if $\mod(i_{sys}, (M-2))=0$, then $i_{sys\_off}=0$; else $i_{sys\_off}=(M-2)-\mod(i_{sys}, (M-2))$, where $n_{sys}$ is a number of the plurality of systematic bits in the at least one RV, M is a modulation order, $N_{mod}$ is a number of modulation symbols, $i_{sys}$ is a starting index of the plurality of systematic bits, and $i_{sys\_off}$ is an offset applied to the starting index of the plurality of systematic bits.

Aspect 13 is the apparatus of any of aspects 1 to 12, where if $\mod(i_{sys}, (M-2))=0$, then $i_{sys\_off}=0$; else $i_{sys\_off}=(M-2)-\mod(i_{sys}, (M-2))$, where $i_{sys}$ is a starting index of the plurality of systematic bits, M is a modulation order, and $i_{sys\_off}$ is an offset applied to the starting index of the plurality of systematic bit.

Aspect 14 is the apparatus of any of aspects 1 to 13, the at least one processor is further configured to: store the plurality of bits in the circular buffer prior to transferring the plurality of bits to the first buffer and the second buffer.

Aspect 15 is the apparatus of any of aspects 1 to 14, where the plurality of bits is transferred to the first buffer and the second buffer based on pseudocode.

Aspect 16 is the apparatus of any of aspects 1 to 15, where the plurality of bits is encoded based on prefix encoding or a low density parity check (LDPC) encoder.

Aspect 17 is the apparatus of any of aspects 1 to 16, where if the plurality of bits is encoded based on the LDPC encoder, an output of the LDPC encoder corresponds to the plurality of bits including a plurality of parity bits.

Aspect 18 is the apparatus of any of aspects 1 to 17, where the plurality of systematic bits is associated with probabilistic shaping.

Aspect 19 is the apparatus of any of aspects 1 to 18, further including a transceiver or an antenna coupled to the at least one processor.

Aspect 20 is a method of wireless communication for implementing any of aspects 1 to 19.

Aspect 21 is an apparatus for wireless communication including means for implementing any of aspects 1 to 19.

Aspect 22 is a computer-readable medium storing computer executable code, where the code when executed by a processor causes the processor to implement any of aspects 1 to 19.

Aspect 23 is an apparatus for wireless communication at a base station including at least one processor coupled to a memory and configured to: encode a plurality of bits associated with quadrature amplitude modulation (QAM), the plurality of bits corresponding to a circular buffer associated with at least one redundancy version (RV), the plurality of bits including a plurality of systematic bits; transfer the plurality of bits from the circular buffer associated with the at least one RV to a first buffer and a second buffer; and map the plurality of bits from the first buffer and the second buffer to a plurality of modulation symbols.

Aspect 24 is the apparatus of aspect 23, where the at least one processor is further configured to: transmit, to a user equipment (UE), the plurality of modulation symbols, where the plurality of modulation symbols is transmitted after the plurality of bits is mapped from the first buffer and the second buffer to the plurality of modulation symbols.

Aspect 25 is the apparatus of any of aspects 23 and 24, where the at least one processor is further configured to: configure at least one channel interleaver for the plurality of bits associated with the QAM.

Aspect 26 is the apparatus of any of aspects 23 to 25, where the at least one channel interleaver includes a first channel interleaver for a plurality of parity bits and a second channel interleaver for the plurality of systematic bits.

Aspect 27 is the apparatus of any of aspects 23 to 26, where the at least one channel interleaver includes a first row-to-column interleaver and a second row-to-column interleaver.

Aspect 28 is the apparatus of any of aspects 23 to 27, where the first row-to-column interleaver is associated with an output of a shaping encoder and the second row-to-column interleaver is associated with a low density parity check (LDPC) output of the plurality of systematic bits.

Aspect 29 is the apparatus of any of aspects 23 to 28, where the at least one processor is further configured to: enable or disable the at least one channel interleaver based on the at least one RV.

Aspect 30 is the apparatus of any of aspects 23 to 29, where transferring the plurality of bits includes: reading the plurality of bits from the circular buffer and writing the plurality of bits to the first buffer and the second buffer.

Aspect 31 is the apparatus of any of aspects 23 to 30, where the plurality of bits further includes a plurality of parity bits.

Aspect 32 is the apparatus of any of aspects 23 to 31, where the first buffer is an amplitude bit buffer and the second buffer is a sign bit buffer.

Aspect 33 is the apparatus of any of aspects 23 to 32, where if a number of the plurality of systematic bits in the at least one RV is equal to zero, the amplitude bit buffer and the sign bit buffer are filled sequentially with a plurality of parity bits of the plurality of bits, where the amplitude bit buffer is filled prior to the sign bit buffer.

Aspect 34 is the apparatus of any of aspects 23 to 33, where if $n_{sys} \leq (M-2)N_{mod}$, and if $\mod(i_{sys}, (M-2))=0$, then $i_{sys\_off}=0$; else $i_{sys\_off}=(M-2)-\mod(i_{sys}, (M-2))$, where $n_{sys}$ is a number of the plurality of systematic bits in the at least one RV, M is a modulation order, $N_{mod}$ is a number of modulation symbols, $i_{sys}$ is a starting index of the plurality of systematic bits, and $i_{sys\_off}$ is an offset applied to the starting index of the plurality of systematic bits.

Aspect 35 is the apparatus of any of aspects 23 to 34, where if $\mod(i_{sys}, (M-2))=0$, then $i_{sys\_off}=0$; else $i_{sys\_off}=(M-2)-\mod(i_{sys}, (M-2))$, where $i_{sys}$ is a starting index of the plurality of systematic bits, M is a modulation order, and $i_{sys\_off}$ is an offset applied to the starting index of the plurality of systematic bits.

Aspect 36 is the apparatus of any of aspects 23 to 35, where the at least one processor is further configured to: store the plurality of bits in the circular buffer prior to transferring the plurality of bits to the first buffer and the second buffer.

Aspect 37 is the apparatus of any of aspects 23 to 36, where the plurality of bits is transferred to the first buffer and the second buffer based on pseudocode.

Aspect 38 is the apparatus of any of aspects 23 to 37, where the plurality of bits is encoded based on prefix encoding or a low density parity check (LDPC) encoder.

Aspect 39 is the apparatus of any of aspects 23 to 38, where if the plurality of bits is encoded based on the LDPC encoder, an output of the LDPC encoder corresponds to the plurality of bits including a plurality of parity bits.

Aspect 40 is the apparatus of any of aspects 23 to 39, where the plurality of systematic bits is associated with probabilistic shaping.

Aspect 41 is the apparatus of any of aspects 23 to 40, further including a transceiver or an antenna coupled to the at least one processor.

Aspect 42 is a method of wireless communication for implementing any of aspects 23 to 41.

Aspect 43 is an apparatus for wireless communication including means for implementing any of aspects 23 to 41.

Aspect 44 is a computer-readable medium storing computer executable code, where the code when executed by a processor causes the processor to implement any of aspects 23 to 41.

What is claimed is:

1. An apparatus for wireless communication at a user equipment (UE), comprising:
    memory; and
    at least one processor coupled to the memory and configured to:
        encode a plurality of bits associated with quadrature amplitude modulation (QAM), the plurality of bits corresponding to a circular buffer associated with at least one redundancy version (RV), the plurality of bits including a plurality of systematic bits, wherein the plurality of systematic bits are grouped into clusters of systematic bits corresponding to constellation shaping of the QAM;
        transfer the plurality of bits from the circular buffer associated with the at least one RV to an amplitude bit buffer and a sign bit buffer for the QAM, wherein one or more of the clusters of systematic bits are transferred to the amplitude bit buffer to preserve the constellation shaping; and
        map the plurality of bits from the amplitude bit buffer and the sign bit buffer to a plurality of modulation symbols.

2. The apparatus of claim 1, wherein the at least one processor is further configured to:
    transmit, to a base station, the plurality of modulation symbols, wherein the plurality of modulation symbols are transmitted after the plurality of bits are mapped from the amplitude bit buffer and the sign bit buffer to the plurality of modulation symbols.

3. The apparatus of claim 1, wherein the at least one processor is further configured to:
    configure at least one channel interleaver for the plurality of bits associated with the QAM.

4. The apparatus of claim 3, wherein the at least one channel interleaver includes a first channel interleaver for a plurality of parity bits and a second channel interleaver for the plurality of systematic bits.

5. The apparatus of claim 3, wherein the at least one channel interleaver includes a first row-to-column interleaver and a second row-to-column interleaver.

6. The apparatus of claim 5, wherein the first row-to-column interleaver is associated with an output of a shaping encoder and the second row-to-column interleaver is associated with a low density parity check (LDPC) output of the plurality of systematic bits.

7. The apparatus of claim 3, wherein the at least one processor is further configured to:
enable or disable the at least one channel interleaver based on the at least one RV.

8. The apparatus of claim 1, wherein transferring the plurality of bits comprises: reading the plurality of bits from the circular buffer and writing the plurality of bits to the amplitude bit buffer and the sign bit buffer.

9. The apparatus of claim 1, wherein the plurality of bits further include a plurality of parity bits.

10. The apparatus of claim 1, wherein if a number of the plurality of systematic bits in the at least one RV ($n_{sys}$) is equal to zero, the amplitude bit buffer and the sign bit buffer are filled sequentially with a plurality of parity bits of the plurality of bits, wherein the amplitude bit buffer is filled prior to the sign bit buffer.

11. The apparatus of claim 1, wherein if $n_{sys} \leq (M-2)N_{mod}$, and if $\mod(i_{sys}, (M-2))=0$, then $i_{sys\_off}=0$; else $i_{sys\_off}=(M-2)-\mod(i_{sys}, (M-2))$, where $n_{sys}$ is a number of the plurality of systematic bits in the at least one RV, M is a modulation order, $N_{mod}$ is a number of modulation symbols, $i_{sys}$ is a starting index of the plurality of systematic bits, and $i_{sys}$ off is an offset applied to the starting index of the plurality of systematic bits.

12. The apparatus of claim 1, wherein if $\mod(i_{sys}, (M-2))=0$, then $i_{sys\_off}=0$; else $i_{sys\_off}=(M-2)-\mod(i_{sys}, (M-2))$, where $i_{sys}$ is a starting index of the plurality of systematic bits, M is a modulation order, and $i_{sys}$ off is an offset applied to the starting index of the plurality of systematic bits.

13. The apparatus of claim 1, wherein the at least one processor is further configured to:
store the plurality of bits in the circular buffer prior to transferring the plurality of bits to the amplitude bit buffer and the sign bit buffer.

14. The apparatus of claim 1, wherein the plurality of bits are transferred to the amplitude bit buffer and the sign bit buffer based on pseudocode.

15. The apparatus of claim 1, wherein the plurality of bits are encoded based on prefix encoding or a low density parity check (LDPC) encoder.

16. The apparatus of claim 15, wherein if the plurality of bits are encoded based on the LDPC encoder, an output of the LDPC encoder corresponds to the plurality of bits including a plurality of parity bits.

17. The apparatus of claim 1, further comprising a transceiver or an antenna coupled to the at least one processor, wherein the plurality of systematic bits are associated with probabilistic shaping.

18. A method of wireless communication at a user equipment (UE), comprising:
encoding a plurality of bits associated with quadrature amplitude modulation (QAM), the plurality of bits corresponding to a circular buffer associated with at least one redundancy version (RV), the plurality of bits including a plurality of systematic bits, wherein the plurality of systematic bits are grouped into clusters of systematic bits corresponding to constellation shaping of the QAM;
transferring the plurality of bits from the circular buffer associated with the at least one RV to an amplitude bit buffer and a sign bit buffer for the QAM, wherein one or more of the clusters of systematic bits are transferred to the amplitude bit buffer to preserve the constellation shaping; and
mapping the plurality of bits from the amplitude bit buffer and the sign bit buffer to a plurality of modulation symbols.

19. An apparatus for wireless communication at a base station, comprising:
memory; and
at least one processor coupled to the memory and configured to:
encode a plurality of bits associated with quadrature amplitude modulation (QAM), the plurality of bits corresponding to a circular buffer associated with at least one redundancy version (RV), the plurality of bits including a plurality of systematic bits, wherein the plurality of systematic bits are grouped into clusters of systematic bits corresponding to constellation shaping of the QAM;
transfer the plurality of bits from the circular buffer associated with the at least one RV to an amplitude bit buffer and a sign bit buffer for the QAM, wherein one or more of the clusters of systematic bits are transferred to the amplitude bit buffer to preserve the constellation shaping; and
map the plurality of bits from the amplitude bit buffer and the sign bit buffer to a plurality of modulation symbols.

20. The apparatus of claim 19, wherein the at least one processor is further configured to:
transmit, to a user equipment (UE), the plurality of modulation symbols, wherein the plurality of modulation symbols are transmitted after the plurality of bits are mapped from the amplitude bit buffer and the sign bit buffer to the plurality of modulation symbols.

21. The apparatus of claim 19, wherein the at least one processor is further configured to:
configure at least one channel interleaver for the plurality of bits associated with the QAM.

22. The apparatus of claim 21, wherein the at least one channel interleaver includes a first channel interleaver for a plurality of parity bits and a second channel interleaver for the plurality of systematic bits,
wherein the at least one channel interleaver includes a first row-to-column interleaver and a second row-to-column interleaver, where the first row-to-column interleaver is associated with an output of a shaping encoder and the second row-to-column interleaver is associated with a low density parity check (LDPC) output of the plurality of systematic bits, or
wherein the at least one processor is further configured to: enable or disable the at least one channel interleaver based on the at least one RV.

23. The apparatus of claim 19, wherein transferring the plurality of bits comprises: reading the plurality of bits from the circular buffer and writing the plurality of bits to the amplitude bit buffer and the sign bit buffer.

24. The apparatus of claim 19, wherein the plurality of bits further include a plurality of parity bits.

25. The apparatus of claim 19, wherein the at least one processor is further configured to:
store the plurality of bits in the circular buffer prior to transferring the plurality of bits to the amplitude bit buffer and the sign bit buffer.

26. The apparatus of claim 19, wherein the plurality of bits are transferred to the amplitude bit buffer and the sign bit buffer based on pseudocode.

27. The apparatus of claim 19, wherein the plurality of bits are encoded based on prefix encoding or a low density parity check (LDPC) encoder, wherein if the plurality of bits is encoded based on the LDPC encoder, an output of the LDPC encoder corresponds to the plurality of bits including a plurality of parity bits.

28. The apparatus of claim 19, further comprising a transceiver or an antenna coupled to the at least one processor, wherein the plurality of systematic bits are associated with probabilistic shaping.

29. A method of wireless communication at a base station, comprising:
- encoding a plurality of bits associated with quadrature amplitude modulation (QAM), the plurality of bits corresponding to a circular buffer associated with at least one redundancy version (RV), the plurality of bits including a plurality of systematic bits, wherein the plurality of systematic bits are grouped into clusters of systematic bits corresponding to constellation shaping of the QAM;
- transferring the plurality of bits from the circular buffer associated with the at least one RV to an amplitude bit buffer and a sign bit buffer for the QAM, wherein one or more of the clusters of systematic bits are transferred to the amplitude bit buffer to preserve the constellation shaping; and
- mapping the plurality of bits from the amplitude bit buffer and the sign bit buffer to a plurality of modulation symbols.

\* \* \* \* \*